United States Patent
Izuno et al.

(10) Patent No.: US 8,840,453 B2
(45) Date of Patent: Sep. 23, 2014

(54) APPARATUS ON WHICH FAN CAN BE MOUNTED

(75) Inventors: Takaharu Izuno, Kawasaki (JP); Mitsuaki Hayashi, Kawasaki (JP); Kenji Joko, Kawasaki (JP); Osamu Saito, Kawasaki (JP); Minoru Fujii, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 332 days.

(21) Appl. No.: 13/297,512

(22) Filed: Nov. 16, 2011

(65) Prior Publication Data

US 2012/0133255 A1    May 31, 2012

(30) Foreign Application Priority Data

Nov. 26, 2010    (JP) ................. 2010-264341

(51) Int. Cl.
*H05K 5/00* (2006.01)
*G06F 1/20* (2006.01)
*H05K 7/20* (2006.01)

(52) U.S. Cl.
CPC .................. *H05K 7/20727* (2013.01)
USPC .................. 454/184; 361/679.46; 361/679.51

(58) Field of Classification Search
CPC .............. H05K 5/00; H05K 7/20; G06F 1/20
USPC .......... 454/184; 361/679.46–679.51
See application file for complete search history.

(56) References Cited

U.S. PATENT DOCUMENTS

| | | | | |
|---|---|---|---|---|
| 4,648,007 A | * | 3/1987 | Garner | 361/695 |
| 6,710,240 B1 | * | 3/2004 | Chen et al. | 174/17 VA |
| 8,305,756 B2 | * | 11/2012 | Regimbal et al. | 361/695 |
| 2002/0145853 A1 | * | 10/2002 | Grouell et al. | 361/695 |
| 2005/0113015 A1 | * | 5/2005 | Crippen et al. | 454/184 |
| 2006/0073783 A1 | * | 4/2006 | Tsai et al. | 454/184 |
| 2008/0151490 A1 | * | 6/2008 | Fan et al. | 361/687 |
| 2009/0262499 A1 | * | 10/2009 | Chou | 361/695 |
| 2011/0250831 A1 | * | 10/2011 | Huang et al. | 454/184 |
| 2012/0162913 A1 | * | 6/2012 | Lai | 361/695 |

FOREIGN PATENT DOCUMENTS

| | | |
|---|---|---|
| JP | 2-72392 U | 6/1990 |
| JP | 2-202098 A | 8/1990 |
| JP | 9-275289 A | 10/1997 |
| JP | 2002-6994 A | 1/2002 |
| JP | 2006-261276 A | 9/2006 |
| JP | 2009-105256 A | 5/2009 |
| JP | 2010-123692 A | 6/2010 |

OTHER PUBLICATIONS

Japanese Office Action issued Mar. 18, 2014, for corresponding Japanese Patent Application No. 2010-264341, with Partial English Translation, 5 pages.

* cited by examiner

*Primary Examiner* — Steven B McAllister
*Assistant Examiner* — Helena Kosanovic
(74) *Attorney, Agent, or Firm* — Fujitsu Patent Center

(57) ABSTRACT

An apparatus on which a fan can be mounted, including a casing; a plurality of cooling fan units arranged in line on a lower portion of the casing and capable of being inserted into and removed from the casing on an individual basis; and a plurality of plate members disposed above the line in which the cooling fan units are arranged and above a gap between the cooling fan units, the plate members extending in a direction to which an upper surface of each of the cooling fan units is substantially perpendicular and in which the cooling fan unit is inserted into and removed from the casing, wherein each of the plate members is supported so as to be able to pivot about its lower end portion toward both directions.

7 Claims, 27 Drawing Sheets

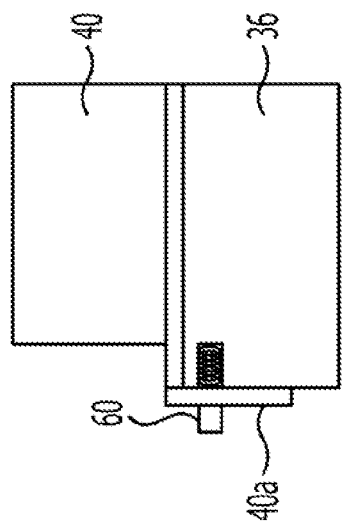
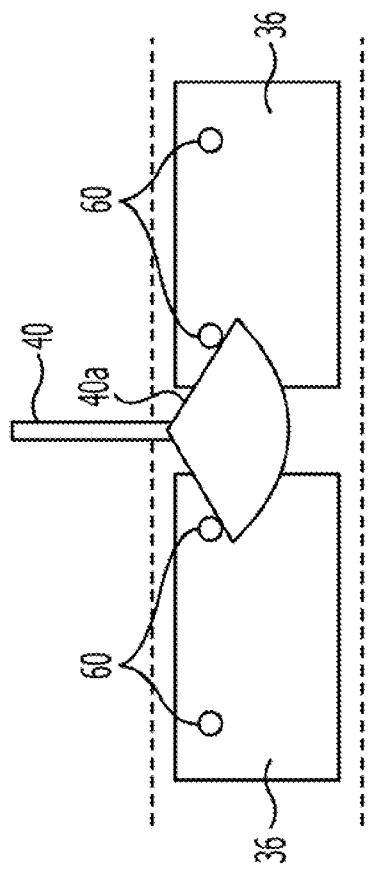

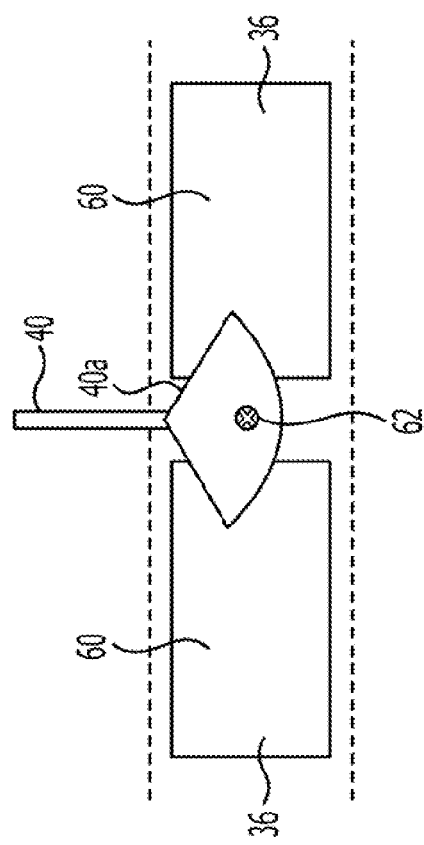
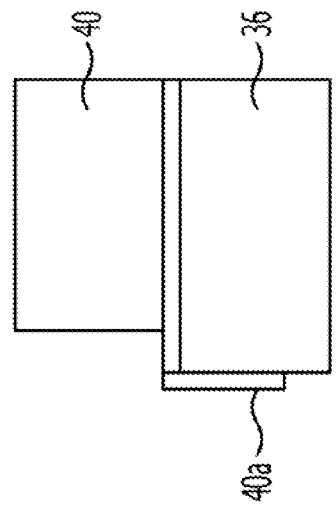
FIG. 25A
FIG. 25B

APPARATUS ON WHICH FAN CAN BE MOUNTED

CROSS-REFERENCE TO RELATED APPLICATIONS

This application is based upon and claims the benefit of priority of the prior Japanese Patent Application No. 2010-264341, filed on Nov. 26, 2010, the entire contents of which are incorporated herein by reference.

FIELD

The embodiments discussed herein are related to an apparatus on which a fan for supplying air flow and cooling an object can be mounted.

BACKGROUND

Some electronic apparatuses or information processing apparatuses, such as server apparatuses, hold many plug-in units (substrates) in their casings. An electronic component mounted on a plug-in unit generates heat in operation, and the plug-in unit is often air-cooled by an air cooling mechanism including a cooling fan.

Typically, an air cooling mechanism includes a plurality of cooling fan units, and they are arranged below the portion in which a plurality of plug-in units is held. The plug-in units can be cooled by the plurality of cooling fan units actuated so as to supply air flow toward the plug-in units from below the plug-in units. For such an air cooling mechanism, the plurality of cooling fan units are arranged in line in the lower portion of the apparatus. The cooling fan units can be individually detached from the casing of the apparatus.

For example, if one of the plurality of cooling fan units breaks down, only that broken cooling fan unit may be detached from the casing of the apparatus in order to be repaired. In this case, the location from which the cooling fan unit has been detached becomes an opened area, and air flow may leak through the opened area to outside the casing. For example, even if air flow from a cooling fan unit adjacent to the broken cooling fan unit travels obliquely in the direction of the plug-in unit corresponding to the broken cooling fan unit, because an opened area lies in the location from which the cooling fan unit has been detached, the air flow may be partially reflected by the plug-in unit and may exit through the opened area to outside the casing. In this case, the air flow from the cooling fan units does not efficiently travel in the vicinity of the plug-in unit. Accordingly, this may lead to decreased efficiency of cooling the plug-in unit that was cooled by the broken cooling fan unit and may result in overheating of that plug-in unit.

For example, Japanese Laid-open Patent Publication No. 2006-261276 discloses the following technique: an air cooling mechanism that reduces a decrease in cooling efficiency occurring when one of cooling fans included in an electronic device is inactive. The air cooling mechanism includes shielding plates disposed on the outer regions of the cooling fans. A leakage of air flow from an inactive cooling fan can be prevented by closing of the shielding plate corresponding to that inactive cooling fan.

SUMMARY

According to an aspect of the invention, an apparatus on which a fan can be mounted, including: a casing; a plurality of cooling fan units arranged in line on a lower portion of the casing and capable of being inserted into and removed from the casing on an individual basis; and a plurality of plate members disposed above the line in which the cooling fan units are arranged and above a gap between the cooling fan units, the plate members extending in a direction to which an upper surface of each of the cooling fan units is substantially perpendicular and in which the cooling fan unit is inserted into and removed from the casing, wherein each of the plate members is supported so as to be able to pivot about its lower end portion toward both directions.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 24A and 24B are illustrations for describing an example of a mechanism used when the flow direction plate is manually operated;

FIGS. 25A and 25B are illustrations for describing another example of the mechanism used when the flow direction plate is manually operated;

DESCRIPTION OF EMBODIMENTS

The shielding plates disclosed in Japanese Laid-open Patent Publication No. 2006-261276 are disposed outside the cooling fans so as to close the openings in which the cooling fans are disposed. Accordingly, when a cooling fan is detached from the apparatus, the corresponding shielding plate is also detached together, so an opened area produced by the detachment of the cooling fan cannot be blocked. Thus, air flow cannot be prevented from leaking through the opened area produced by the detachment of the cooling fan, and a decrease in cooling efficiency of the apparatus cannot be avoided.

Embodiments are described below with reference to the drawings.

Figure 1:
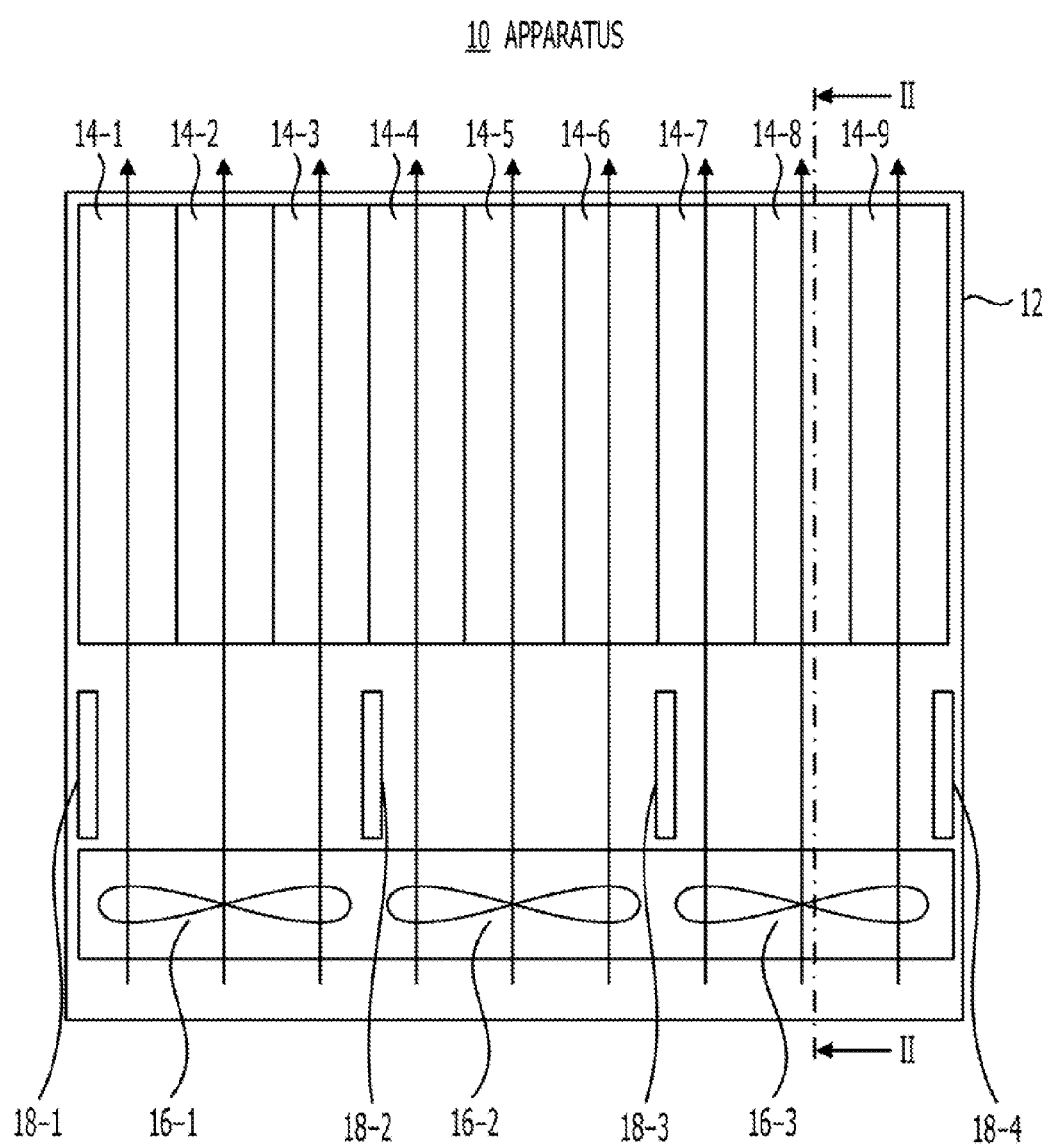
FIG. 1 is a front view of an apparatus that includes an air cooling mechanism according to a first embodiment.
Figure 2:
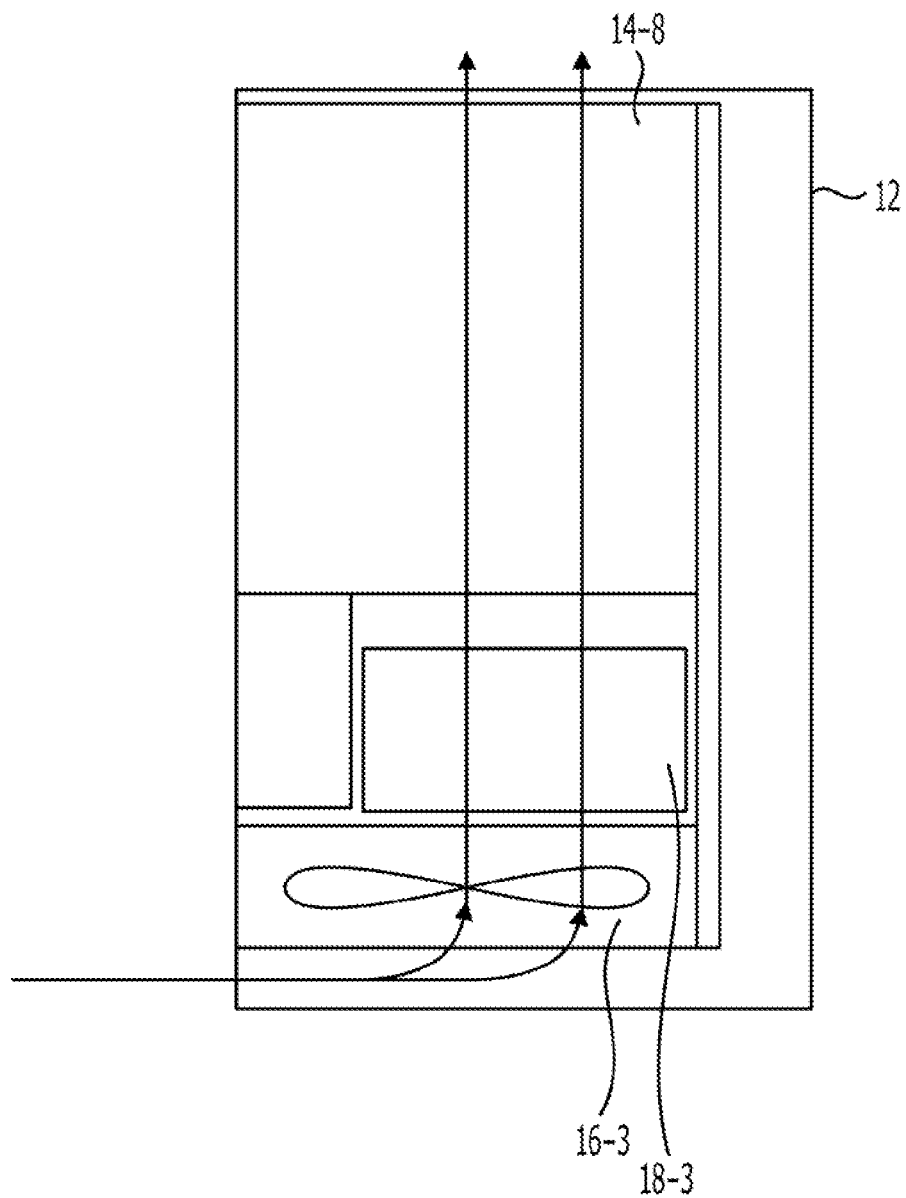
FIG. 2 is a cross-sectional view taken along the line II-II of FIG. 1.

FIG. 1 is a front view of an apparatus that includes an air cooling mechanism according to a first embodiment and illustrates a state where the front panel is removed and the inside of the apparatus is made visible. FIG. 2 is a cross-sectional view taken along the line II-II of FIG. 1.

An apparatus 10 illustrated in FIG. 1 holds a plurality of plug-in units 14-1 to 14-9 in a casing 12 and a plurality of cooling fan units 16-1 to 16-3 on the bottom portion of the casing 12. In the following description, the plug-in units 14-1 to 14-9 are sometimes referred to collectively as the plug-in unit(s) 14, and the cooling fan units 16-1 to 16-3 are sometimes referred to collectively as the cooling fan unit(s) 16.

For the present embodiment, partition plates 18-1 to 18-4 are disposed between the cooling fan unit 16 and the plug-in unit 14. Each of the partition plates 18-1 to 18-4 is a plate-like member and is disposed at the location corresponding to one of both ends of a cooling fan unit. Each of the partition plates 18-1 to 18-4 can pivot about its lower end portion. In the following description, the partition plates 18-1 to 18-4 are sometimes referred to collectively as the partition plate(s) 18.

In the case where the cooling fan unit 16 is incorporated in the casing 12, as illustrated in FIG. 1, the partition plate 18 extends in a direction substantially perpendicular to the cooling fan unit 16. Accordingly, upward air flow occurring when the cooling fan unit 16 is actuated can pass through the space in which the partition plate 18 is arranged and travel in a direction toward the plug-in unit 14. This air flow cools the plug-in unit 14.

Figure 3:
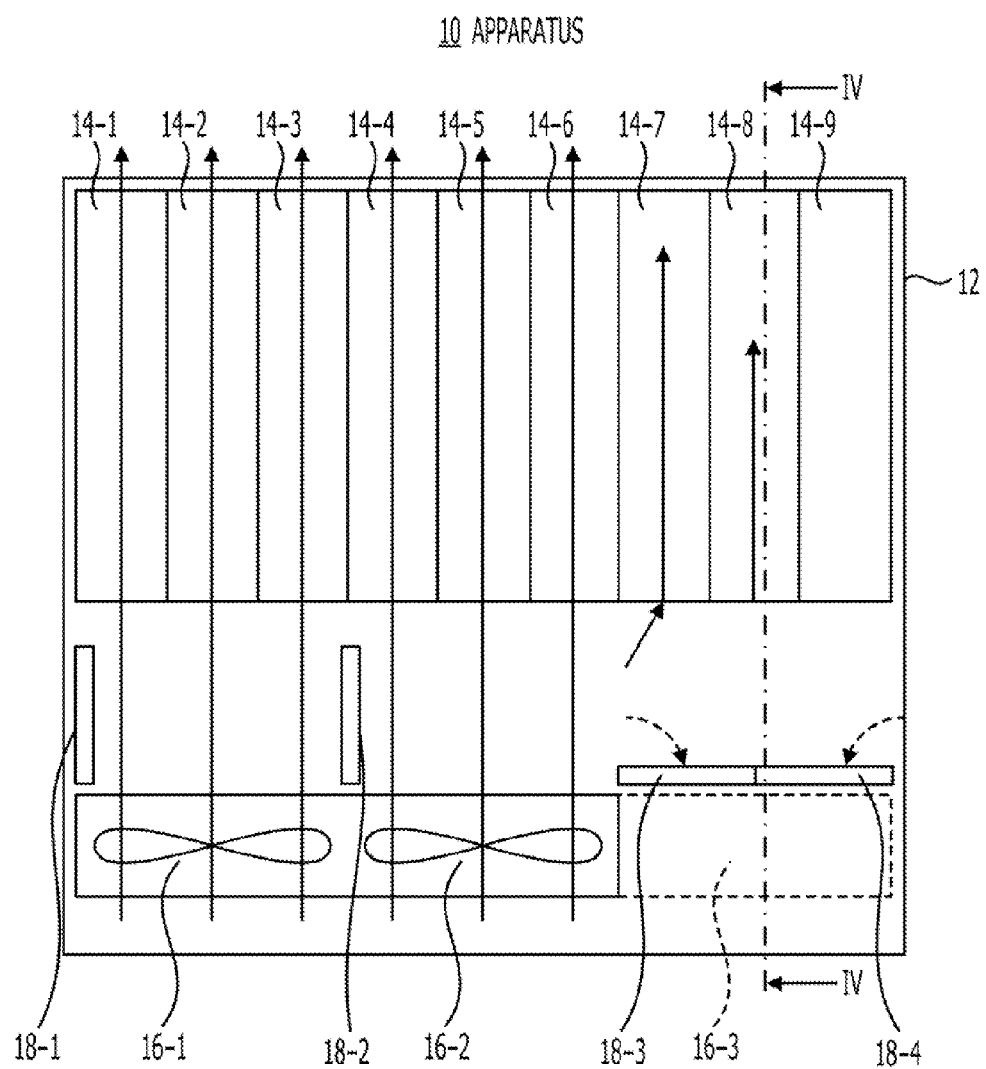
FIG. 3 is a front view of the apparatus illustrated in FIG. 1 in a state where one cooling fan unit is detached from the casing thereof.
Figure 4:
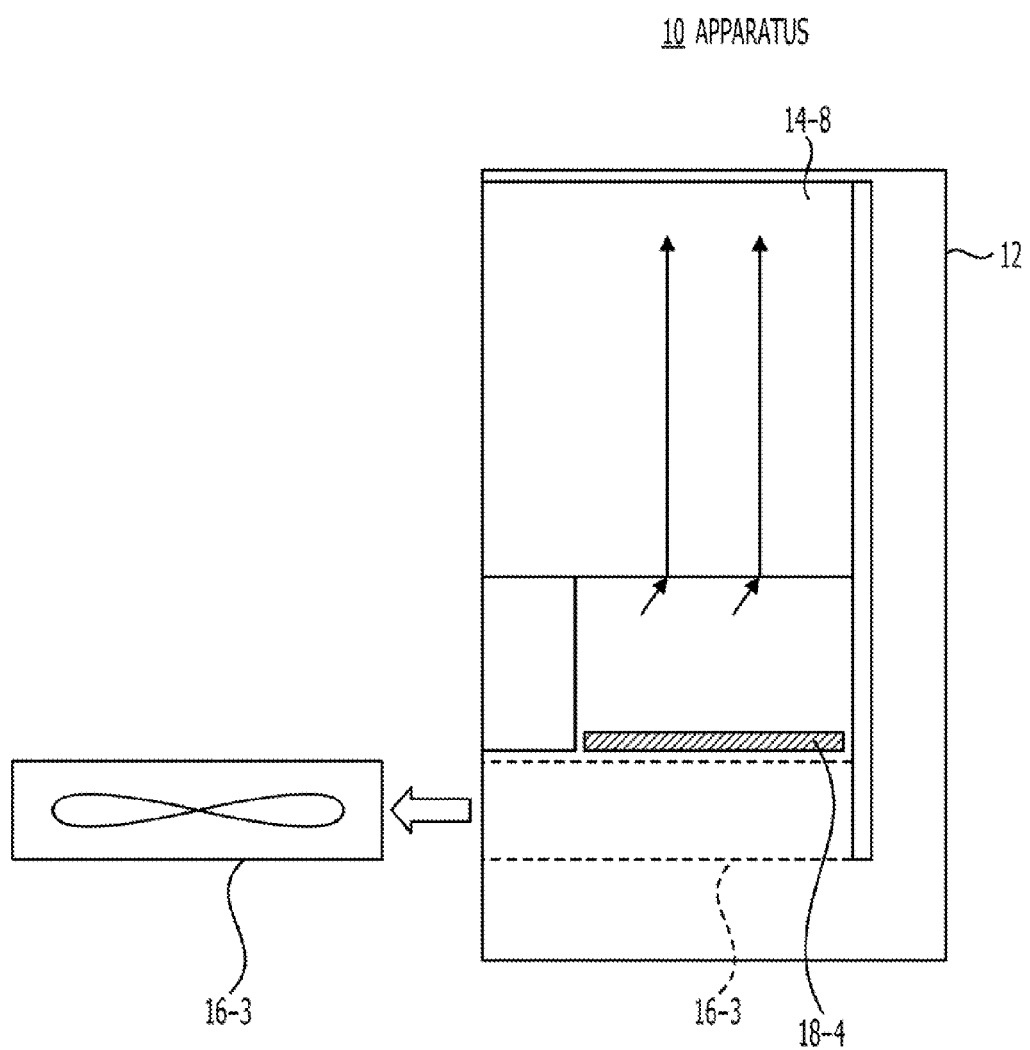
FIG. 4 is a cross-sectional view taken along the line IV-IV of FIG. 3.

FIG. 3 is a front view of the apparatus 10 illustrated in FIG. 1 in a state where one cooling fan unit 16 (cooling fan unit 16-3) is detached from the casing 12. FIG. 4 is a cross-sectional view taken along the line IV-IV of the FIG. 3.

The partition plate 18 can pivot about its lower end portion, as previously described. When the cooling fan unit 16 is detached from the casing 12, the opened area produced by the detachment of the cooling fan unit 16 can be closed by an inward fall of the partition plates 18 at both ends of the location from which the cooling fan unit 16 has been detached. FIG. 3 illustrates a state where the cooling fan unit 16-3 is detached and the opened area is closed by an inward fall of the partition plates 18-3 and 18-4 at both ends thereof. The length of each of the partition plates 18-3 and 18-4 is approximately half the length (the width in the front view) of the cooling fan unit 16, and the opened area is closed by an inward fall of both of the partition plates 18-3 and 18-4 by approximately 90°.

Before or after the cooling fan unit 16 is detached, each of the partition plates 18 may be manually made to pivot. Alternatively, the partition plate 18 may pivot in conjunction with attachment or detachment of the cooling fan unit 16 to or from the casing 12. That is, a mechanism of causing the partition plate 18 to be pushed by the cooling fan unit 16 such that the partition plate 18 extends substantially vertically when the cooling fan unit 16 is attached to the casing 12 and causing the partition plate 18 to automatically pivot and fall inward when the cooling fan unit 16 is detached from the casing 12 may preferably be provided. A specific example of such a mechanism is described below.

As illustrated in FIG. 3, blocking the opened area produced by detachment of the cooling fan unit 16-3 with the partition plates 18-3 and 18-4 can prevent air flow from the cooling fan unit 16-2 from leaking through that opened area toward outside the casing 12. Thus, the air flow from the cooling fan unit 16-2 does not leak to outside the casing 12 through the opened area and efficiently travels toward the plug-in units 14-7 to 14-9. Accordingly, even when the cooling fan unit 16-3 is detached, the plug-in units 14-7 to 14-9 can be maintained in a state where they are cooled to some extent.

Similarly, in the case of detachment of the cooling fan unit 16-1, the opened area, the produced opened area is closed by an inward fall of the partition plates 18-1 and 18-2; in the case of detachment of the cooling fan unit 16-2, the produced opened area is closed by an inward fall of the partition plates 18-2 and 18-3.

As described above, an apparatus on which a fan can be mounted according to the present embodiment includes the detachable cooling fan units 16 and the partition plates 18 for closing an opened area.

In this way, because an opened area produced by detachment of a cooling fan unit from an apparatus is closed by a plate member, even if one cooling fan unit is detached, air flow from other cooling fans does not leak and thus a decrease in cooling efficiency can be suppressed.

Figure 5:
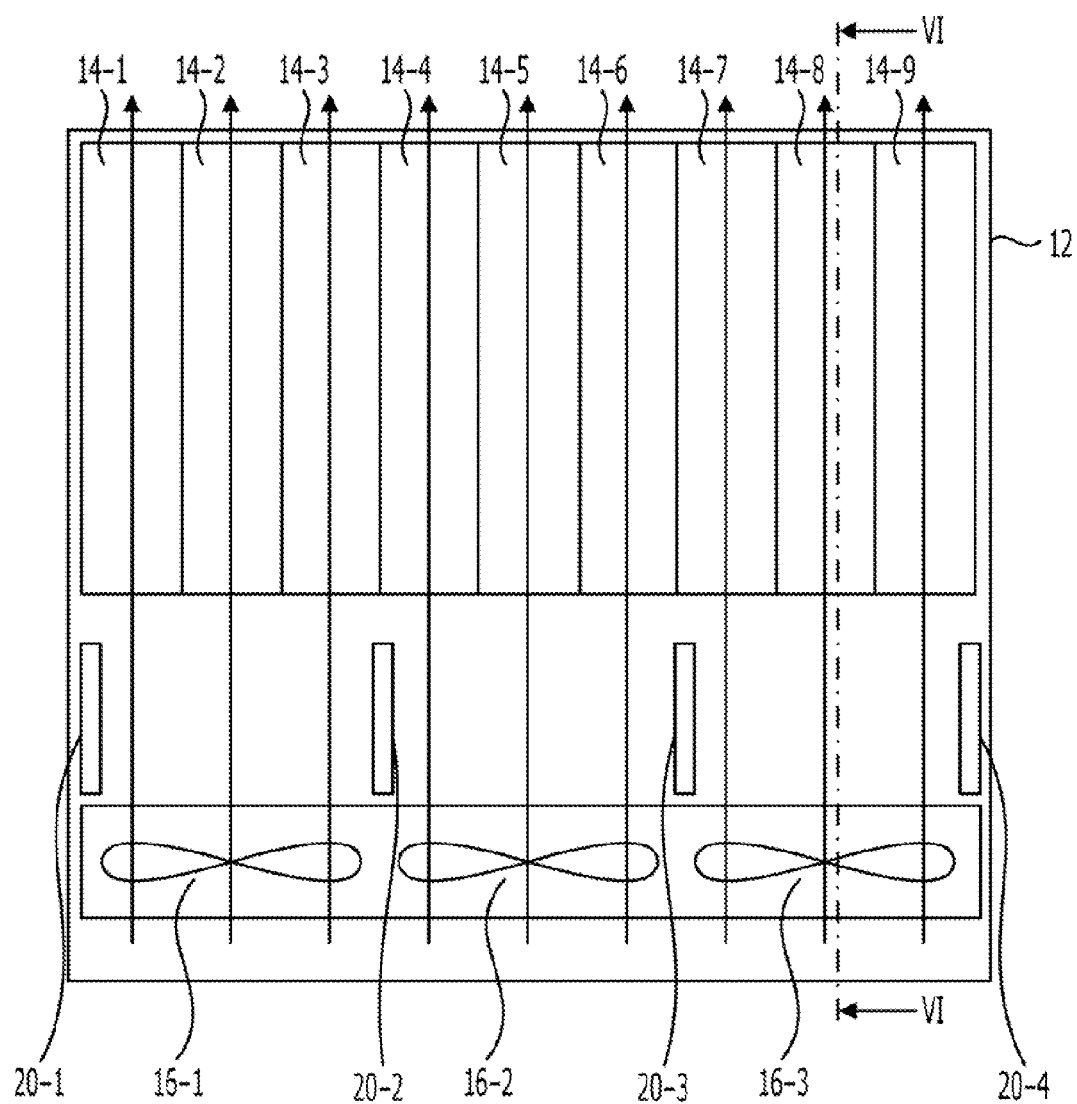
FIG. 5 is a cross-sectional view of an apparatus that includes an air cooling mechanism according to a second embodiment.
Figure 6:
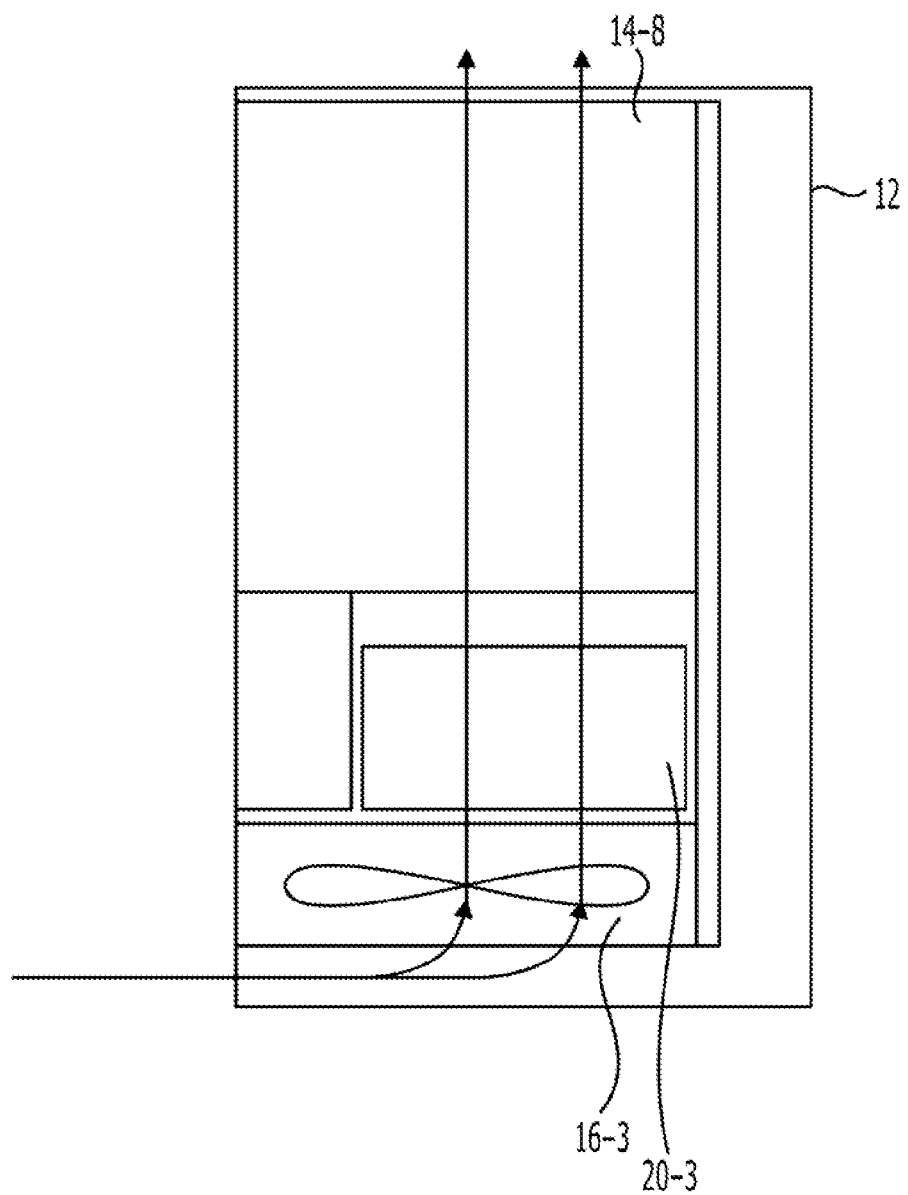
FIG. 6 is a cross-sectional view taken along the line VI-VI of FIG. 5.

FIG. 5 is a front view of an apparatus that includes an air cooling mechanism according to a second embodiment and illustrates a state where the front panel is removed and the inside of the apparatus is made visible. FIG. 6 is a cross-sectional view taken along the line VI-VI of FIG. 5. In FIGS. 5 and 6, the same reference numerals are used as in FIG. 1 for parts equivalent to components illustrated in FIG. 1, and the description thereof is omitted.

The basic configuration of the air cooling mechanism according to the second embodiment is substantially the same as that according to the first embodiment. The present embodiment differs in that the partition plates 18-1 to 18-4 are replaced with flow direction plates 20-1 to 20-4. In the following description, the flow direction plates 20-1 to 20-4 are sometimes referred to collectively as the flow direction plate(s) 20.

Figure 7:
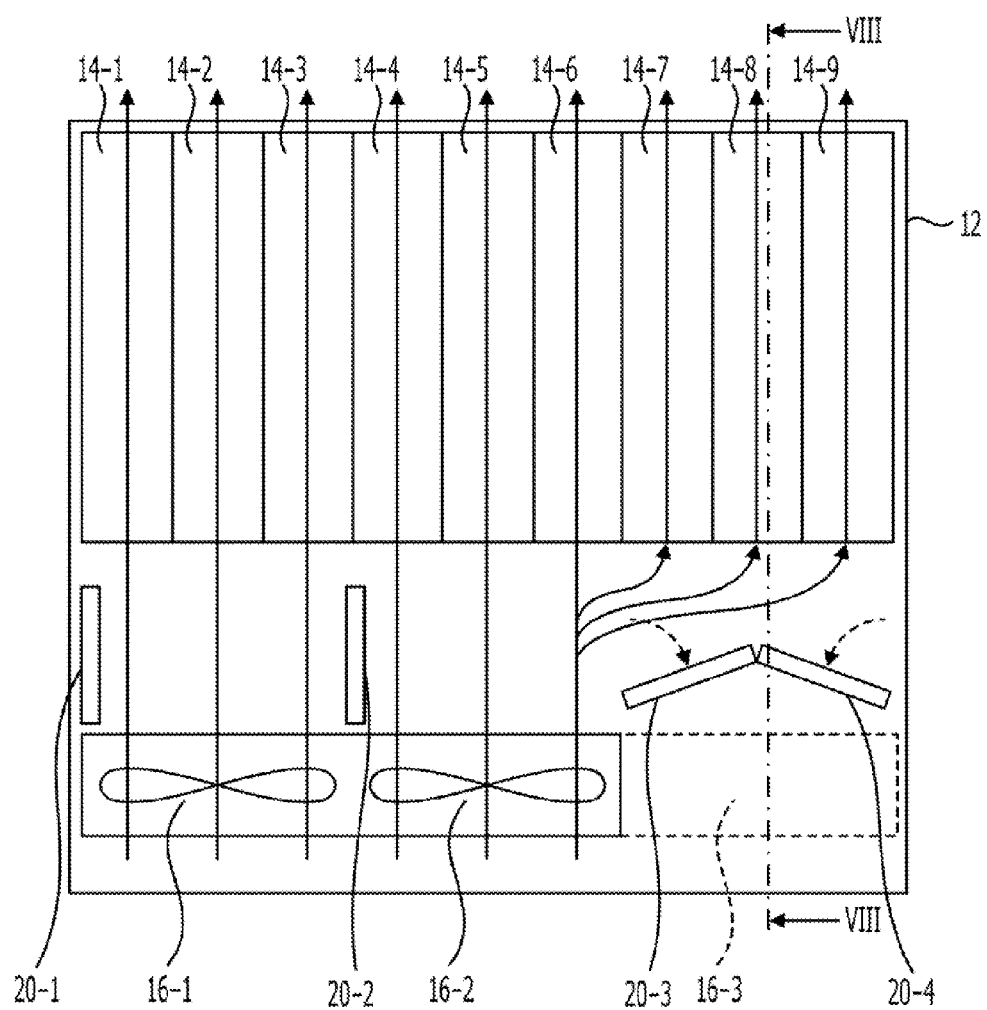
FIG. 7 is a front view of the apparatus illustrated in FIG. 5 in a state where one cooling fan unit is detached from the casing thereof.
Figure 8:
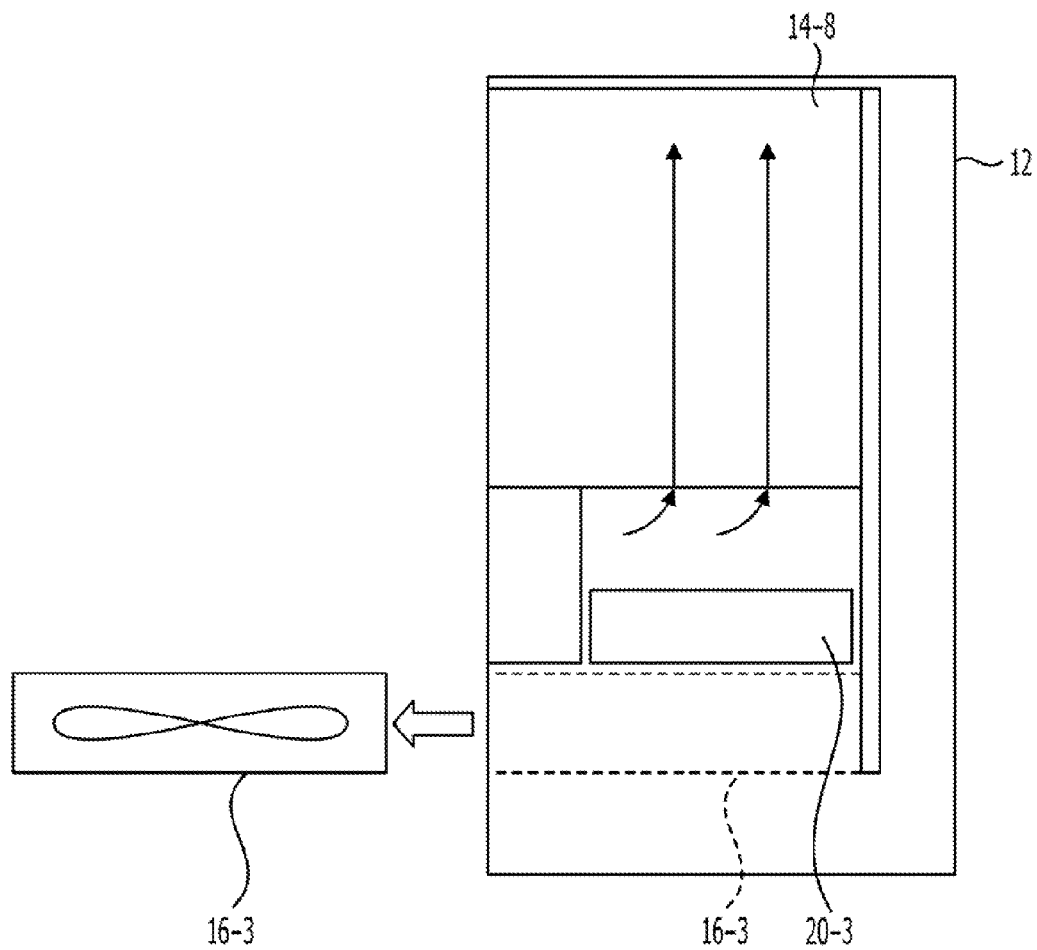
FIG. 8 is a cross-sectional view taken along the line VIII-VIII of FIG. 7.

The flow direction plate 20 can pivot about its lower end portion, as in the case of the partition plate 18. The length (vertical length in FIG. 5) of the flow direction plate 20 is slightly longer than that of the partition plate 18. Thus, as illustrated in FIG. 7, when the cooling fan unit 16-3 is detached and the flow direction plates 20-3 and 20-4 fall inward, they do not fall by 90°; they pivot by, for example, only approximately 60°, so that the produced opened area is closed by a substantially inverted V shape. At this time, there may be a gap between the flow direction plates 20-3 and 20-4. The angle of falling of the flow direction plate 20 is determined by the length of the flow direction plate 20.

In the state where the flow direction plates 20-3 and 20-4 close the opened area, as illustrated in FIG. 7, the flow direction plate 20-3 does not pivot fully to a horizontal position but stops in an inclined state. In this state, a part of air flow from the active cooling fan unit 16-2 travels along the flow direction plate 20-3, as indicated by the arrows in FIG. 7, toward the plug-in units 14-7 to 14-9. That is, a part of air flow from the cooling fan unit 16-2 can be guided in a direction toward the plug-in units 14-7 to 14-9 by the inclined flow direction plate 20-3. Accordingly, the plug-in units 14-7 to 14-9, which were cooled by air flow from the detached cooling fan unit 16-3, can be cooled by the part of the air flow from the cooling fan unit 16-2. Thus, even if the cooling fan unit 16-3 is detached, the plug-in units 14-7 to 14-9 can be cooled to some extent, and overheating of the plug-in units 14-7 to 14-9 can be suppressed.

Similarly, when the cooling fan unit 16-1 is detached, the flow direction plates 20-1 and 20-2 fall inward and the produced opened area is closed, and a part of air flow from the cooling fan unit 16-2 is guided by the flow direction plate 20-2 toward the plug-in units 14-1 to 14-3. When the cooling fan unit 16-2 is detached, the flow direction plates 20-2 and 20-3 fall inward and the produced opened area is closed, and a part of air flow from the cooling fan units 16-1 and 16-3 is guided by the flow direction plates 20-2 and 20-3 toward the plug-in units 14-4 to 14-6.

As described above, an apparatus on which a fan can be mounted according to the present embodiment includes the detachable cooling fan units 16 and the flow direction plates 20 for closing an opened area and guiding air flow toward a plug-in unit 14 that was cooled by a detached cooling fan unit 16.

Figure 9:
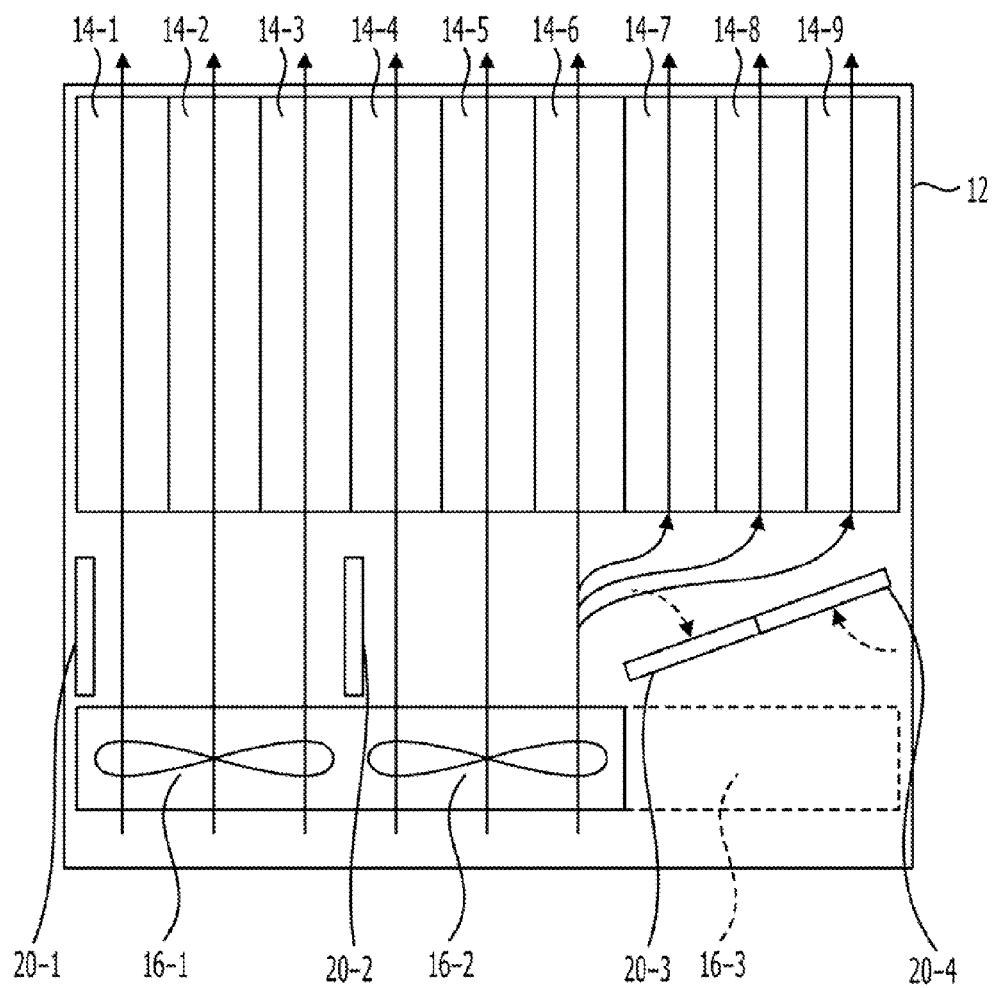
FIG. 9 is a front view of an apparatus having a structure in which rightmost and leftmost flow direction plates pivot about their upper ends and raise their lower ends.
Figure 10:
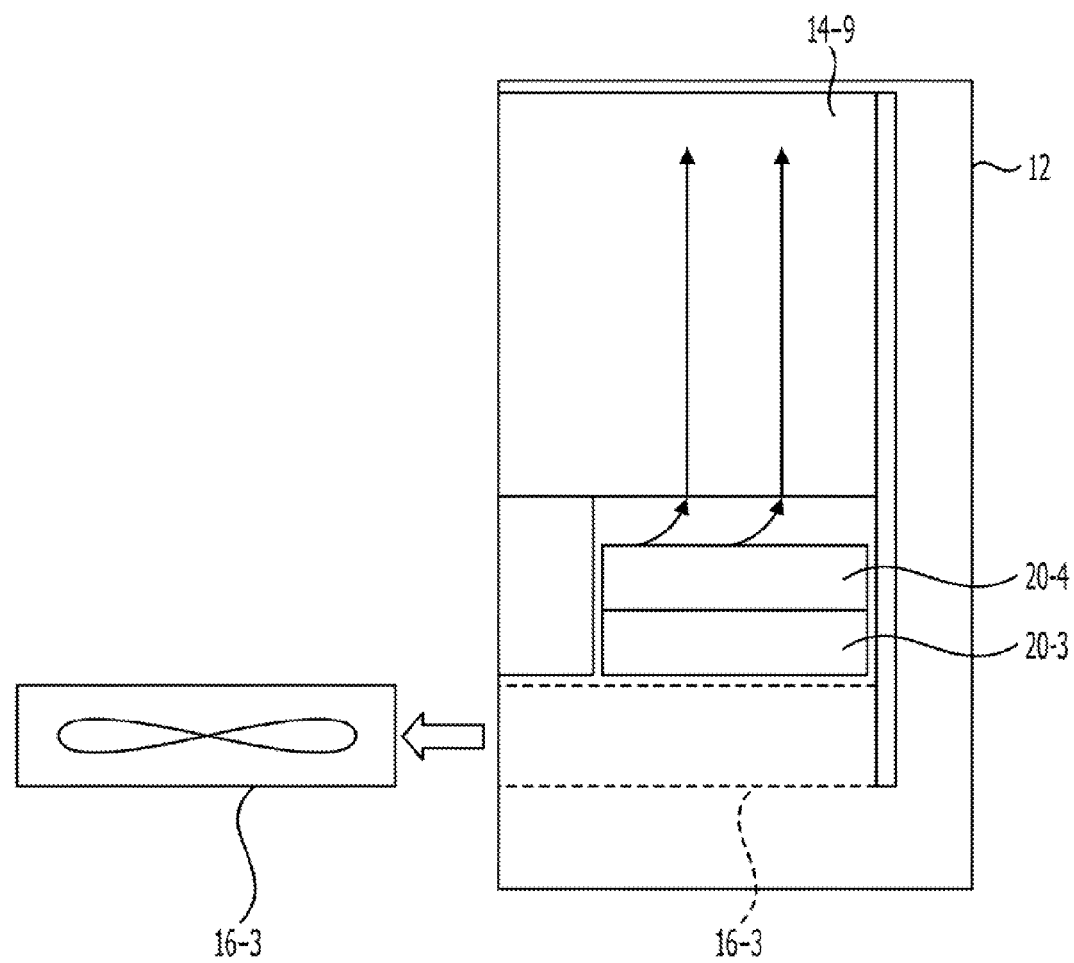
FIG. 10 is a side view of the apparatus illustrated in FIG. 9.

The example illustrated in FIGS. 5 to 8 is a structure in which the rightmost and leftmost flow direction plates 20 fall inward. Alternatively, the rightmost and leftmost flow direction plates 20 may pivot about their upper ends and raise their lower ends. FIG. 9 is a front view of an apparatus having such a structure in which the rightmost and leftmost flow direction plates 20 pivot about their upper ends and raise their lower ends. FIG. 10 is a side view of the apparatus illustrated in FIG. 9 and illustrates the inside thereof.

In FIG. 9, the flow direction plate 20-4 at the right end pivots about its upper end and is fixed at the location where it is aligned with the flow direction plate 20-3. Thus, the opened area produced by detachment of the cooling fan unit 16-3 is closed by the flow direction plate 20-3 obliquely extending from the right end of the cooling fan unit 16-2 and the flow direction plate 20-4 extending from an end of the flow direction plate 20-3 in the same direction. Accordingly, a part of air flow from the cooling fan unit 16-2 is guided by the flow direction plate 20-3 and also guided by the flow direction plate 20-4 toward the plug-in units 14-7 to 14-9. In particular, the flow direction plate 20-4 extending along the direction in which the flow direction plate 20-3 extends can provide an advantage of being able to also guide air flow toward the rightmost plug-in unit 14-9.

The above apparatus on which a fan can be mounted according to the second embodiment is specifically described next.

Figure 11:
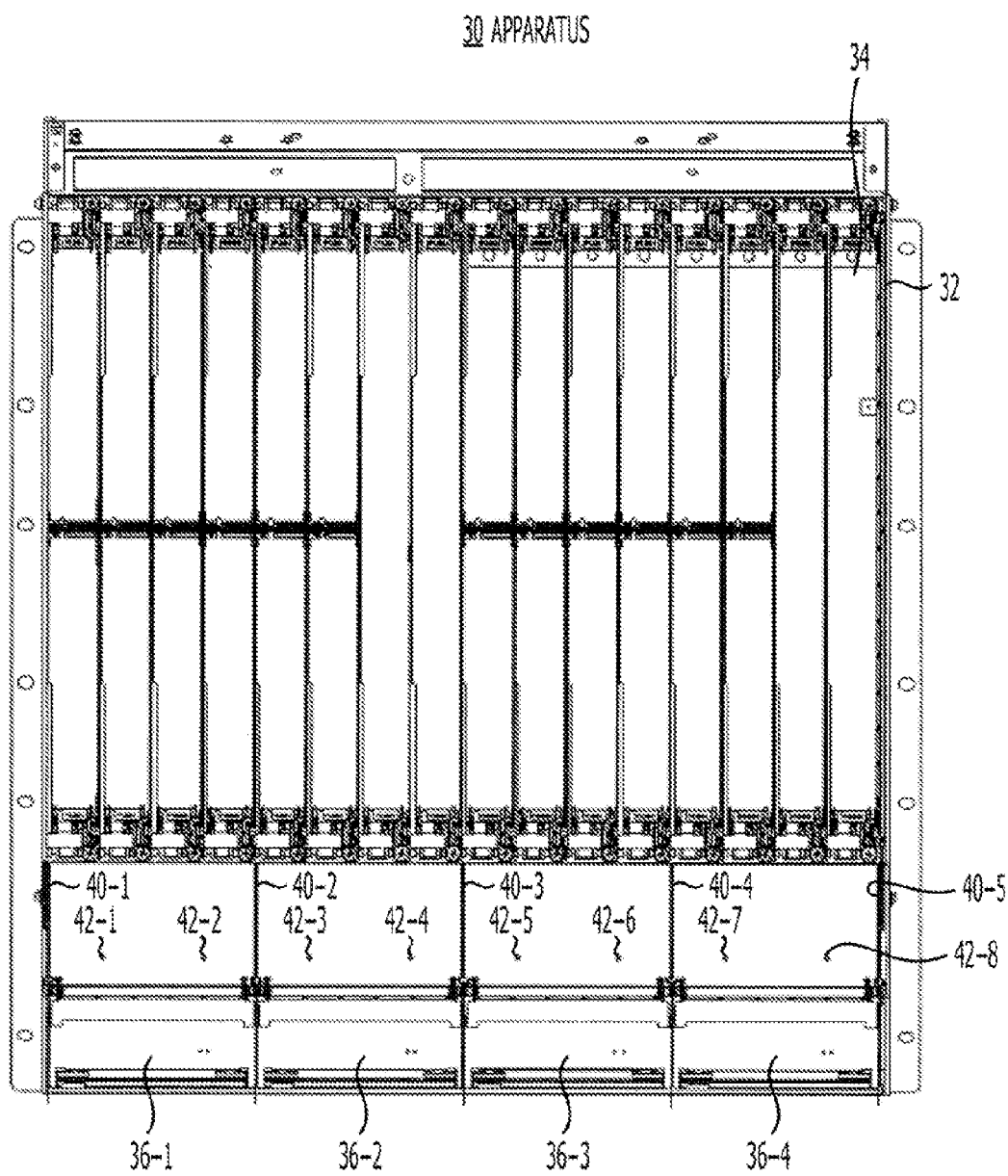
FIG. 11 is a front view of an apparatus in which the air cooling mechanism is incorporated according to the second embodiment.
Figure 12:
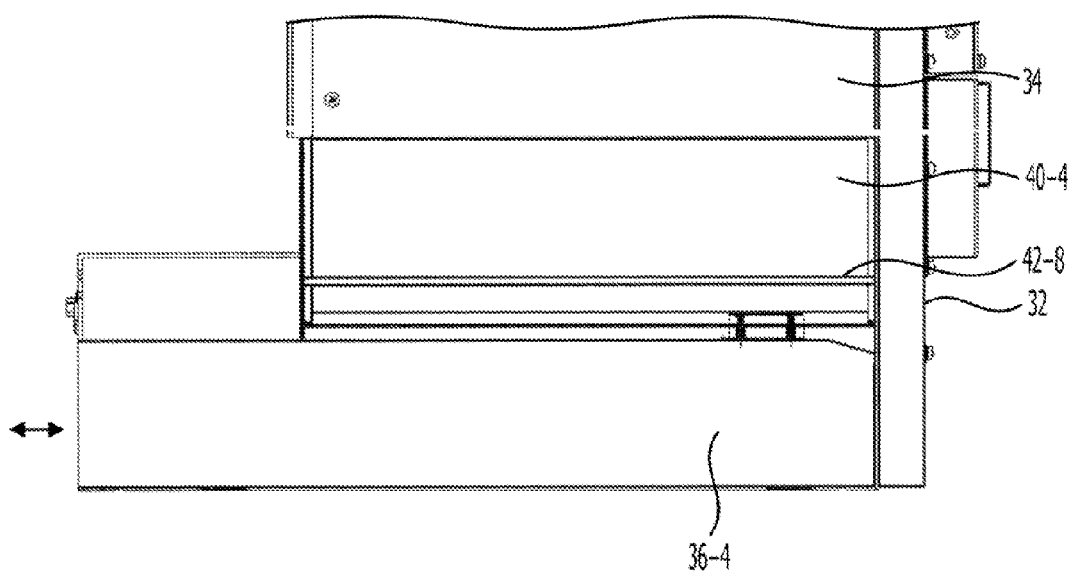
FIG. 12 is a side view of a lower portion of the apparatus illustrated in FIG. 11.

FIG. 11 is a front view of an apparatus 30 in which an air cooling mechanism according to the second embodiment is incorporated and illustrates a state where the front panel is removed and the inside of the apparatus is made visible. FIG. 12 is a side view of the apparatus 30 illustrated in FIG. 11 and illustrates the inside thereof.

The apparatus 30 can be an electronic apparatus that holds many substrates, such as an optical communications apparatus. The apparatus 30 holds plug-in units 34 containing substrates in a casing 32 such that they are arranged in line. FIG. 11 illustrates an example in which 16 plug-in units 34 aligned laterally in the drawing are held in the casing 32. Cooling fan units 36-1 to 36-4 are arranged in line below the plug-in units 34 with predetermined gaps therebetween. The cooling fan units 36-1 to 36-4 send air flow upward and cool the plug-in units 34. Air flow from the cooling fan units 36-1 to 36-4 travels along the plug-in units 34 and passes through in-between the plug-in units 34 to the upper portion of the casing 32. In the following description, the cooling fan units 36-1 to 36-4 are sometimes referred to collectively as the cooling fan unit 36.

The cooling fan units 36 are individually attached to the lower portion of the casing 32. That is, the cooling fan units 36 can be inserted into and removed from the front side of the casing 32 on an individual basis. Accordingly, if one of the cooling fan units 36 breaks down, for example, only the broken cooling fan unit 36 can be extracted from the casing 32 to be repaired or replaced.

Flow direction plates 40-1 to 40-5 are arranged in a space below the plug-in units 34 and above the cooling fan units 36. The flow direction plate 40-1 is arranged substantially directly above the left end portion of the leftmost cooling fan unit 36-1. The flow direction plate 40-1 is supported so as to be able to pivot in a direction in which it falls toward the upper surface of the cooling fan unit 36-1. The flow direction plate 40-2 is arranged substantially directly above the portion where the cooling fan units 36-1 and 36-2 are in contact with each other. The flow direction plate 40-2 is supported so as to be able to pivot in both a direction in which it falls toward the upper surface of the cooling fan unit 36-1 and a direction in which it falls toward the upper surface of the cooling fan unit 36-2. The flow direction plate 40-3 is arranged substantially directly above the portion where the cooling fan units 36-2 and 36-3 are in contact with each other. The flow direction plate 40-3 is supported so as to be able to pivot in both a direction in which it falls toward the upper surface of the cooling fan unit 36-2 and a direction in which it falls toward the upper surface of the cooling fan unit 36-3. The flow direction plate 40-4 is arranged substantially directly above the portion where the cooling fan units 36-3 and 36-4 are in contact with each other. The flow direction plate 40-4 is supported so as to be able to pivot in both a direction in which it falls toward the upper surface of the cooling fan unit 36-3 and a direction in which it falls toward the upper surface of the cooling fan unit 36-4. The flow direction plate 40-5 is arranged substantially directly above the right end portion of the rightmost cooling fan unit 36-4. The flow direction plate 40-5 is supported so as to be able to pivot in a direction in which it falls toward the upper surface of the cooling fan unit

36-4. In the following description, the flow direction plates 40-1 to 40-5 are sometimes referred to collectively as the flow direction plate 40.

Stopper pins 42-1 to 42-8 are disposed in a space between the cooling fan units 36 and the plug-in units 34. Each of the stopper pins 42-1 to 42-8 is a long slender bar member extending between the rear and front sides of the casing 32. When the flow direction plates 40-1 to 40-5 fall, the flow direction plates 40-1 to 40-5 come into contact with the corresponding stopper pins 42-1 to 42-8 and are maintained in the locations where they are inclined. In the following description, the stopper pins 42-1 to 42-8 are sometimes referred to collectively as the stopper pin(s) 42.

For the present embodiment, each of the flow direction plates 40-2 to 40-4 is a simple plate-like member and its width is slightly longer than the width of the cooling fan unit 36. For example, if the cooling fan unit 36-2 is extracted and detached from the casing 32, the flow direction plate 40-2 falls toward the upper surface of the cooling fan unit 36-2 and the flow direction plate 40-3 also falls toward the upper surface of the cooling fan unit 36-2. At this time, the flow direction plate 40-2 is maintained in the state where it is inclined in contact with the stopper pin 42-3, and the flow direction plate 40-3 is maintained in the state where it is inclined in contact with the stopper pin 42-4. In this state, the flow direction plates 40-2 and 40-3 face each other and form a substantially inverted V shape, and this closes the opened area produced by the extraction of the cooling fan unit 36-2. At this time, there may be a gap between the flow direction plates 40-2 and 40-3.

Accordingly, a part of air flow from the cooling fan unit 36-1 travels along the inclined flow direction plate 40-2 closing a half of the opened area and is guided so as to be supplied to the plug-in units 34 that were cooled by the air flow from the cooling fan unit 36-2. A part of air flow from the cooling fan unit 36-3 travels along the inclined flow direction plate 40-3 closing the other half of the opened area and is guided so as to be supplied to the plug-in units 34 that were cooled by the air flow from the cooling fan unit 36-2.

Figure 13:
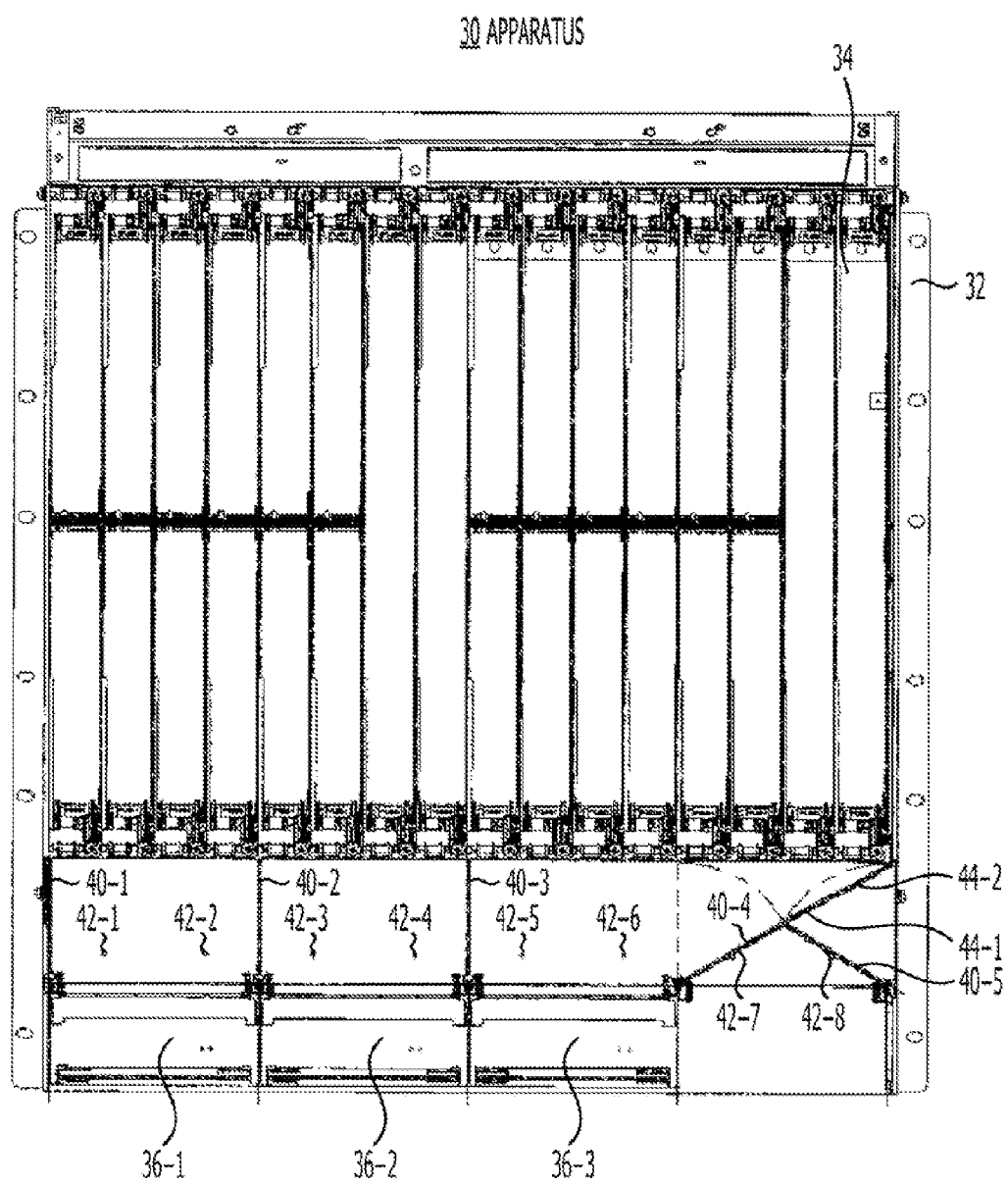
FIG. 13 is a front view of the apparatus in a state where one cooling fan unit is extracted.
Figure 14:
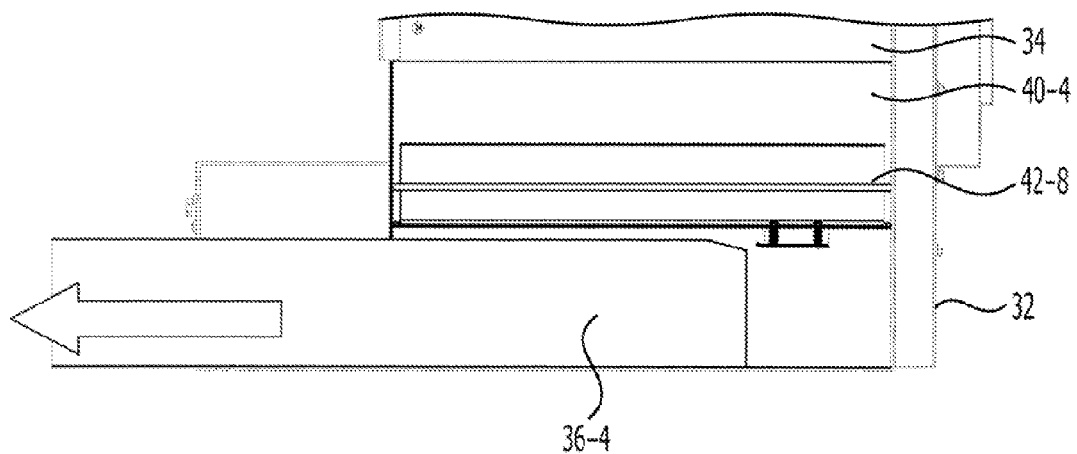
FIG. 14 is a side view of a lower portion of the apparatus illustrated in FIG. 13.

In contrast, each of the flow direction plates 40-1 and 40-5 at both ends is not a simple plate-like member but is the one in which a plate-like member substantially similar to the flow direction plates 40-2 to 40-4 is connected to two additional plate-like members. FIG. 13 is a front view of the apparatus 30 with the cooling fan unit 36-4 being extracted and illustrates a state where the front panel is removed and the inside is made visible. FIG. 14 is a side view of the lower portion of the apparatus 30 with the cooling fan unit 36-4 being extracted and illustrates the inside.

When the cooling fan unit 36-4 is extracted from the casing 32, the flow direction plates 40-4 and 40-5 automatically pivot about their lower ends toward the location in which the cooling fan unit 36-4 was present in conjunction with the movement of the cooling fan unit 36-4. The flow direction plate 40-4 comes into contact with the stopper pin 42-7 and stops. The flow direction plate 40-5 comes into contact with the stopper pin 42-8 and stops. In this way, the flow direction plates 40-4 and 40-5 close the opened area produced by the extraction of the cooling fan unit 36-4 from the casing 32. A mechanism for causing the flow direction plates 40 to pivot in conjunction with an operation of extracting the cooling fan unit 36 is described below.

Figure 15:
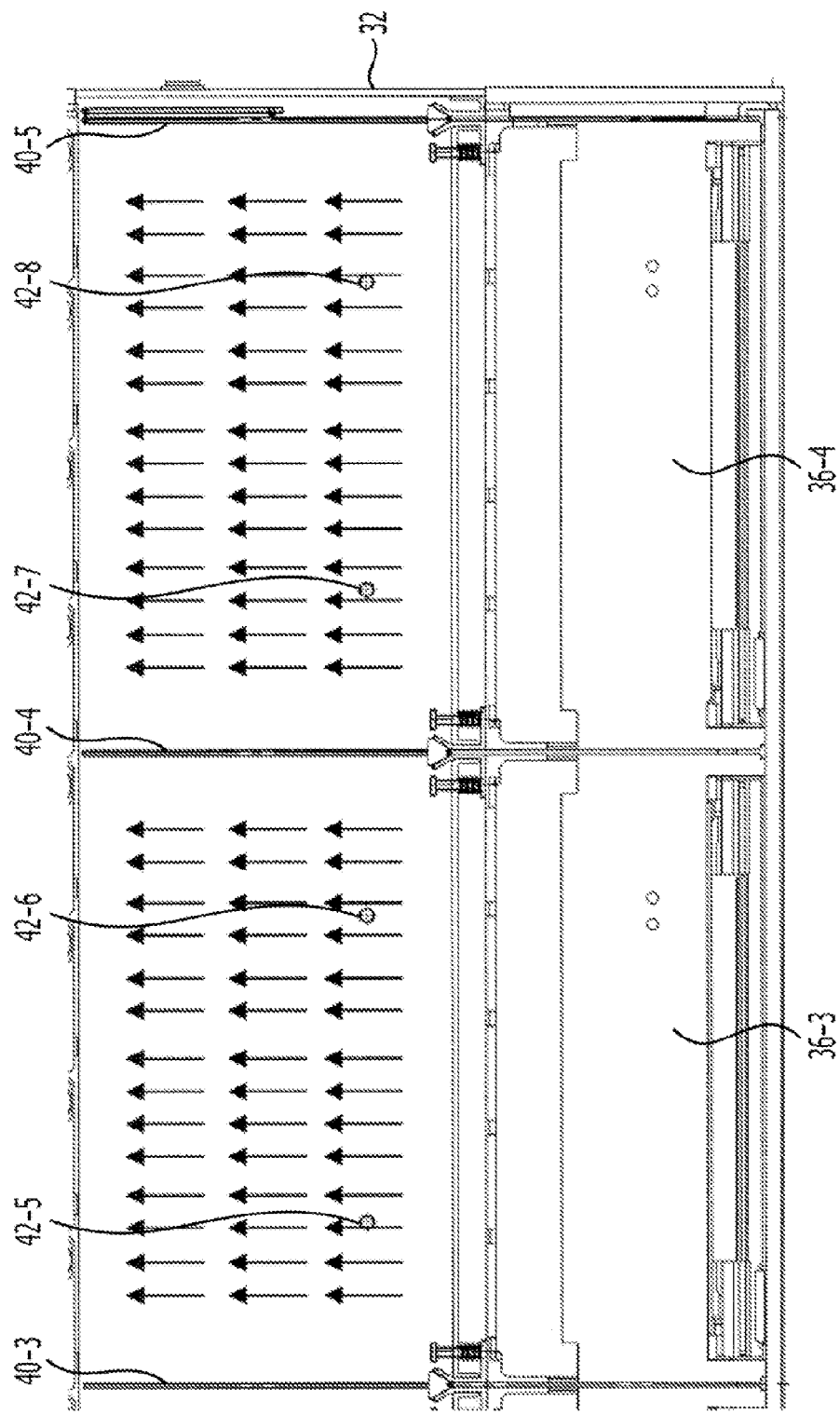
FIG. 15 is an enlarged view of a part of the apparatus illustrated in FIG. 11.

A guide plate 44-1 is attached to the upper end of the flow direction plate 40-5 so as to be able to pivot, and a guide plate 44-2 is attached to the leading end of the guide plate 44-1 so as to be able to pivot. When the flow direction plate 40-5 extends in a substantially vertical direction, as illustrated in FIG. 15, the guide plates 44-1 and 44-2 extend along the flow direction plate 40-5 in a folded state. The upper end of the guide plate 44-2 is attached to a side wall of the casing 32 so as to be able to pivot.

Figure 16:
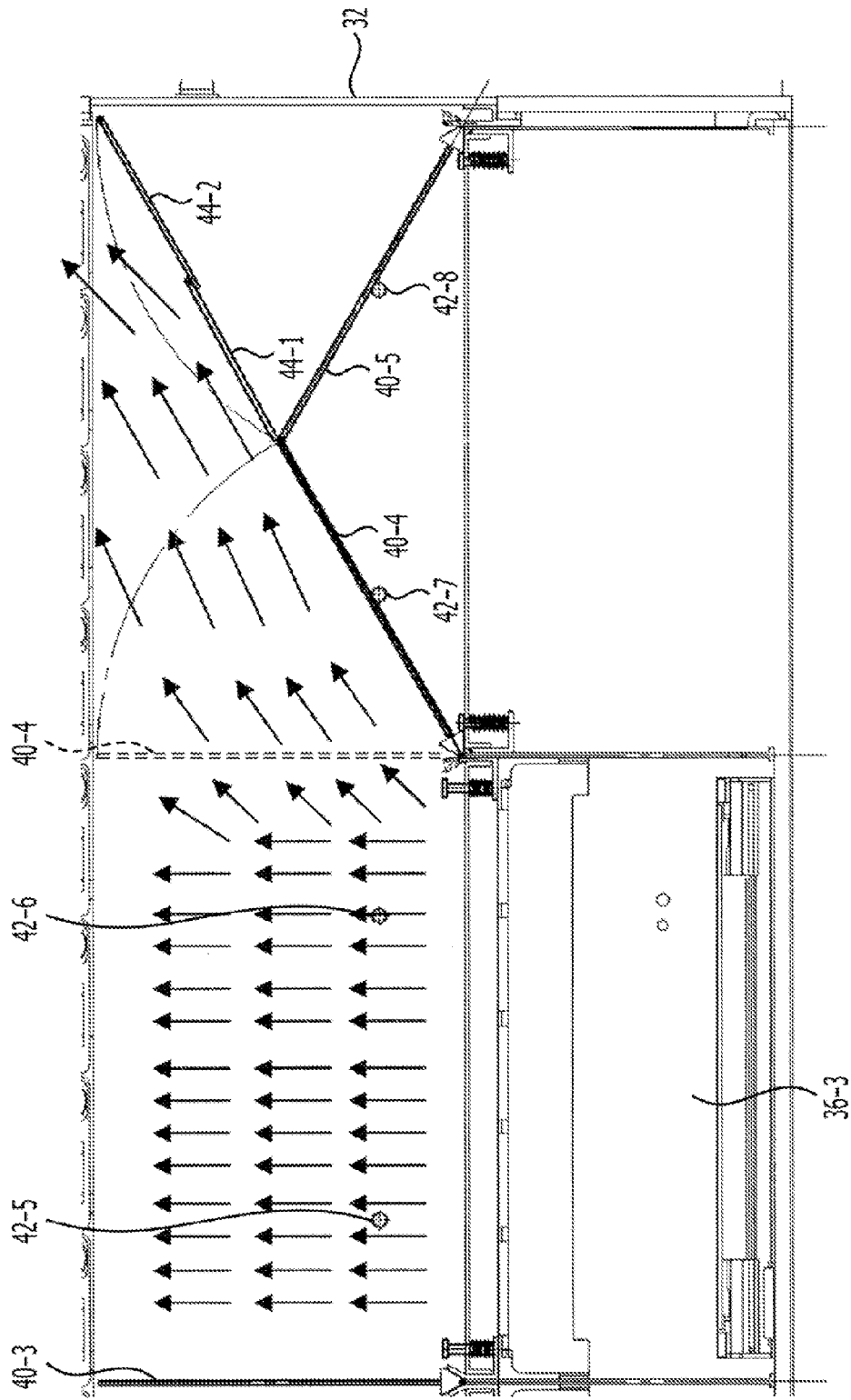
FIG. 16 is an enlarged view of a part of the apparatus illustrated in FIG. 13.

Here, when the flow direction plate 40-5 pivots and falls in a direction in which the cooling fan unit 36-4 was present, the upper end of the guide plate 44-1 moves together with the pivoting of the flow direction plate 40-5. Thus, as illustrated in FIG. 16, the guide plates 44-1 and 44-2 are stretched and aligned with each other. Accordingly, the guide plates 44-1 and 44-2 are shaped like a single plate. The leading end (end supported by the upper end of the flow direction plate 40-5 so as to be able to pivot) is in contact with or adjacent to the upper end of the flow direction plate 40-4. This enables air flow supplied from the cooling fan unit 36-3 and traveling along the flow direction plate 40-4 to travel along the guide plates 44-1 and 44-2. Accordingly, air flow can also be guided to the plug-in units 34 substantially directly above the guide plates 44-1 and 44-2. Therefore, air flow can also be supplied to the plug-in units 34 held in the vicinity of a side wall of the casing 32 and can cool them more efficiently, in comparison with the case where the guide plates 44-1 and 44-2 are absent.

Figure 17:
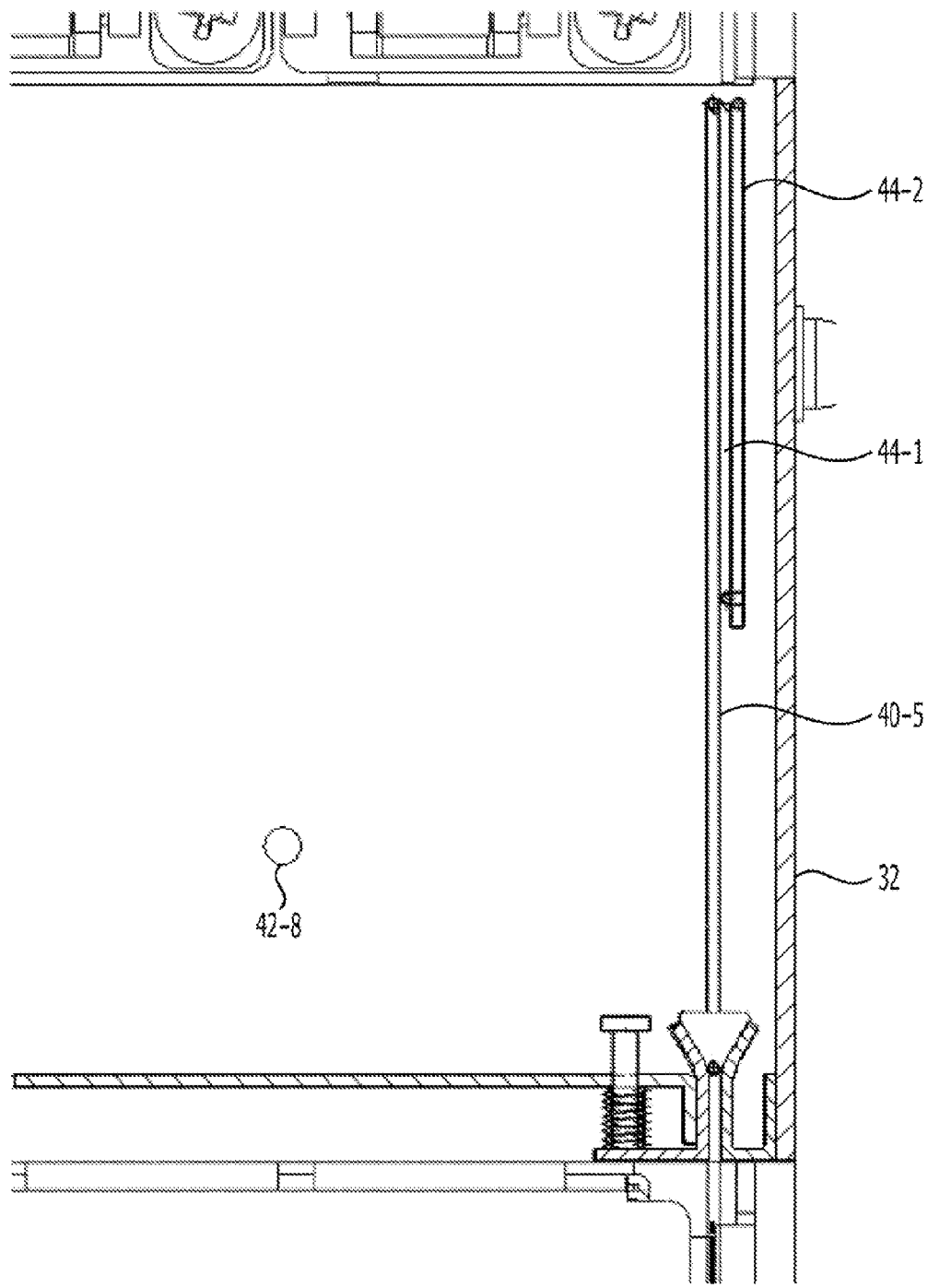
FIG. 17 is an illustration for describing movement of a guide plate in conjunction with pivoting of a flow direction plate.
Figure 18:
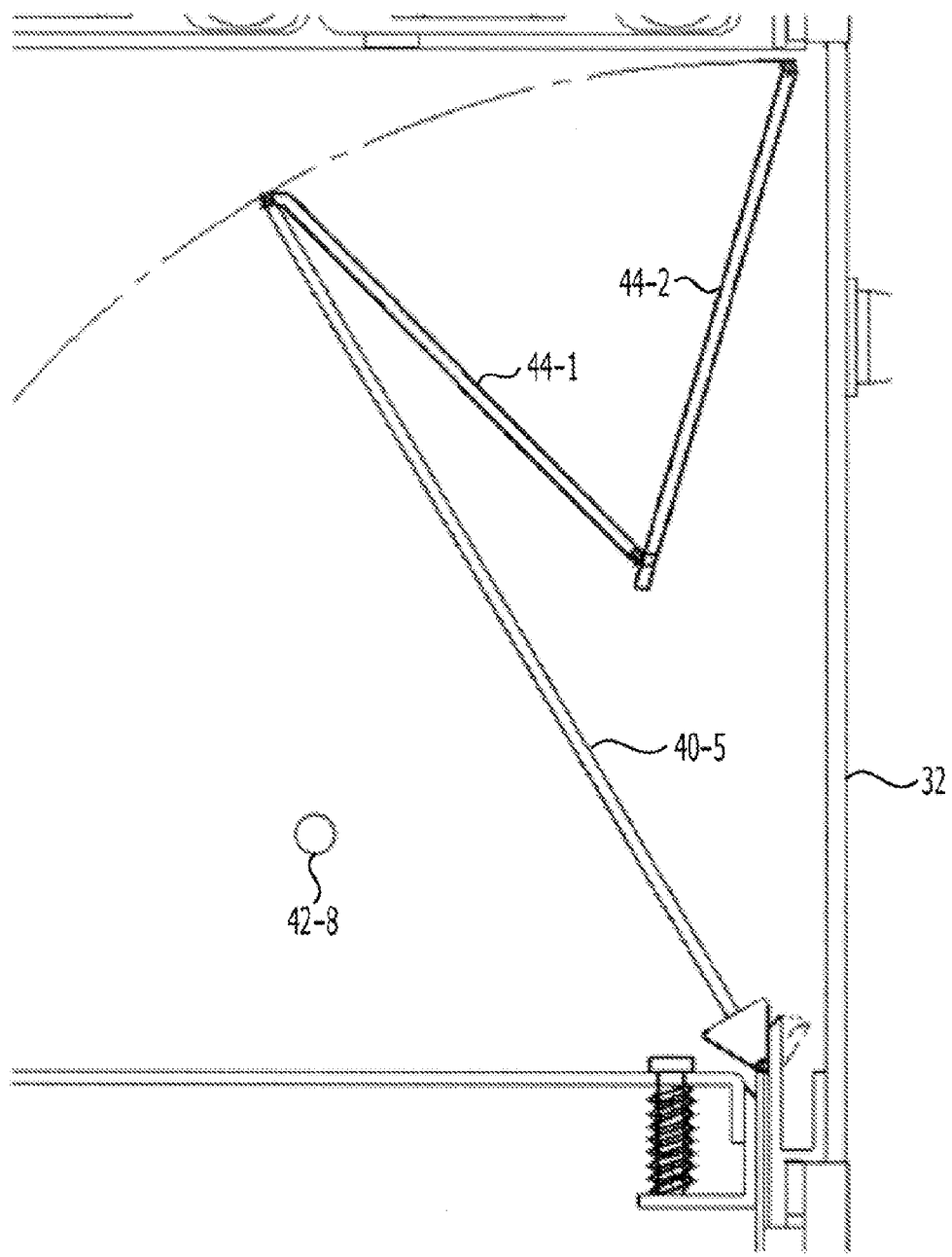
FIG. 18 is an illustration for describing movement of the guide plate in conjunction with pivoting of the flow direction plate.
Figure 19:
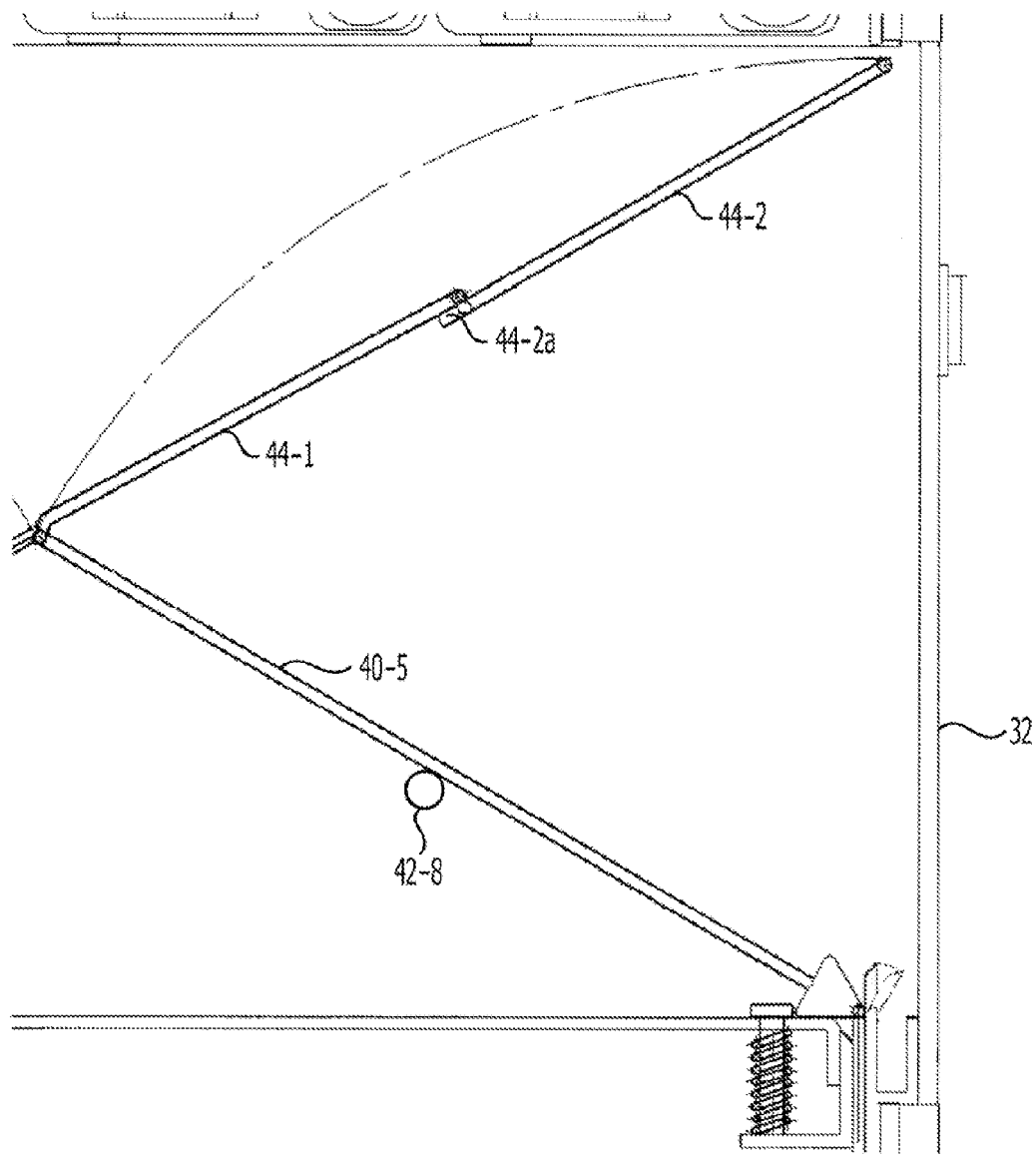
FIG. 19 is an illustration for describing movement of the guide plate in conjunction with pivoting of the flow direction plate.

FIGS. 17, 18, and 19 illustrate how the guide plates 44-1 and 44-2 move together with pivoting of the flow direction plate 40-5. FIG. 17 illustrates a state where the flow direction plate 40-5 stands substantially vertically. In this state, the guide plate 44-1 substantially vertically extends along the flow direction plate 40-5, and the guide plate 44-2 substantially vertically extends along the guide plate 44-1. The guide plates 44-1 and 44-2 are connected together at their lower end portions in FIG. 17 such that they can pivot. The upper end of the guide plate 44-1 in FIG. 17 is fixed to the flow direction plate 40-5 such that the guide plate 44-1 can pivot. The upper end of the guide plate 44-2 in FIG. 17 is fixed to the casing 32 so as to be unable to move.

As illustrated in FIG. 18, when the flow direction plate 40-5 pivots and becomes inclined, the guide plates 44-1 and 44-2 move such that they pivot about their lower end portions and their upper end portions are opened. When the flow direction plate 40-5 becomes inclined and comes into contact with the stopper pin 42-8, as illustrated in FIG. 19, the guide plates 44-1 and 44-2 are arranged substantially linearly. Here, at the portion where the guide plates 44-1 and 44-2 are connected so as to be able to pivot, the pivotal point lies in the tail end portion of the guide plate 44-1 and lies in a location slightly inwardly deviating from the tail end of the guide plate 44-2. Accordingly, a tail end portion 44-2a of the guide plate 44-2 overlaps the guide plate 44-1, as illustrated in FIG. 19. After the guide plates 44-1 and 44-2 are arranged substantially linearly, they do not pivot further. This can prevent bending of the guide plates 44-1 and 44-2 in the opposite direction caused by pivoting of the connection portion of the guide plates 44-1 and 44-2 more than necessary.

An automatic pivoting mechanism for causing the flow direction plate 40 to pivot in conjunction with an operation of extracting the cooling fan unit 36 is described next.

Figure 20:
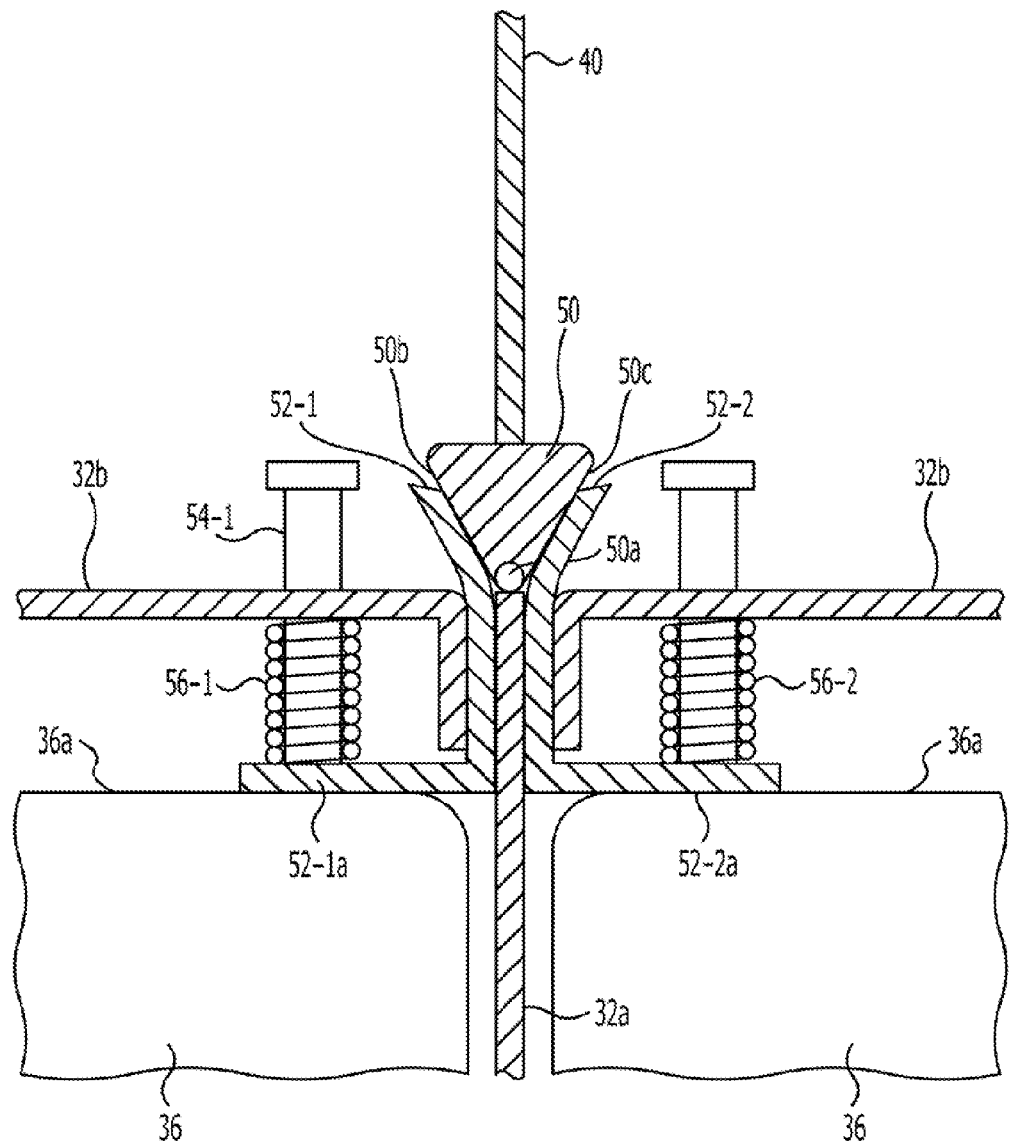
FIG. 20 is a cross-sectional view of an automatic pivoting mechanism when the flow direction plate extends substantially vertically.
Figure 21:
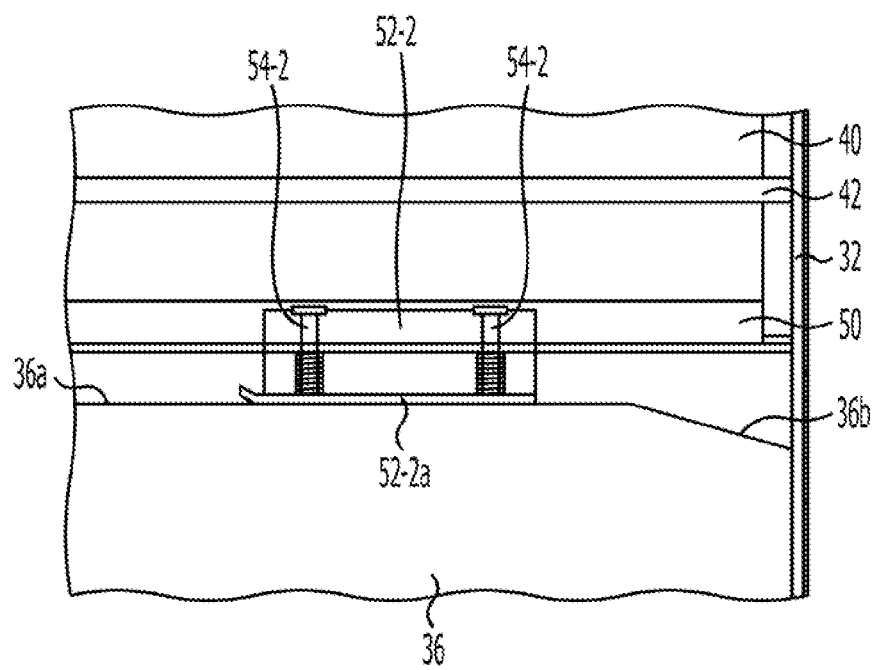
FIG. 21 is a side view of the automatic pivoting mechanism when the flow direction plate extends substantially vertically.

FIG. 20 is a cross-sectional view of the automatic pivoting mechanism, and FIG. 21 is a side view thereof. The automatic pivoting mechanism is attached to the lower end of the flow direction plate 40 and includes a support member 50 for supporting the flow direction plate 40 and leaf springs 52-1 and 52-2 for supporting the support member 50 from both sides. The support member 50 is a member having a substantially triangular cross section and is attached to the flow direction plate 40 such that the flow direction plate 40 substantially vertically extends from one side of the triangular shape. The support member 50 includes a rotating shaft 50a attached in the vicinity of a vertex portion that faces the side of the triangular shape of the support member 50. The rotating shaft 50a is made of a material having high hardness so as to generate small friction.

The support member 50 is supported in a state where the rotating shaft 50a is in contact with the upper end of a separator 32a for forming portions of the casing 32 in which the cooling fan units 36 are held. In this state, because the support member 50 is not fixed and is allowed to pivot substantially horizontally about the rotating shaft 50a, the support member 50 (i.e., the flow direction plate 40) is maintained in a substantially vertical state by the leaf springs 52-1 and 52-2 being in contact with both sides (two sides of the triangular shape) of the support member 50.

The leaf springs 52-1 and 52-2 are in contact with slopes 50b and 50c (corresponding to sides of the triangular shape) of the support member 50, respectively, and are made of a spring member that can be easily deformed. Each of the leaf springs 52-1 and 52-2 extends in the gap between the separator 32a and a top 32b forming the space for holding the cooling fan unit 36. The leading ends of the leaf springs 52-1 and 52-2 are in contact with the slopes 50b and 50c, respectively. The width of the gap between the top 32b and the separator 32a forming the space for holding the cooling fan unit 36 is substantially the same as the thickness of each of the leaf springs 52-1 and 52-2. The portion of each of the leaf springs 52-1 and 52-2 between the top 32b and the separator 32a is supported so as to extend in a substantially vertical direction.

The leaf springs 52-1 and 52-2 include bases 52-1a and 52-2a, respectively. The leading ends of pins 54-1 and 54-2 passing through holes of the tops 32b and extending from above the tops 32b are fixed to the bases 52-1a and 52-2a, respectively. Coil springs 56-1 and 56-2 are disposed around the pins 54-1 and 54-2 between the tops 32b and the bases 52-1a and 52-2a, respectively. The coil springs 56-1 and 56-2 downwardly urge the bases 52-1a and 52-2a, respectively. FIG. 20 illustrates a state where the cooling fan units 36 are incorporated and the bases 52-1a and 52-2a are at locations upwardly pressed by the upper surfaces of the cooling fan units 36. The leaf springs 52-1 and 52-2 are upwardly moved by the bases 52-1a and 52-2a being upwardly pressed, the upper ends and their adjacent regions of the leaf springs 52-1 and 52-2 are opened outwardly, elastically deformed, and in contact with the slopes 50b and 50c of the support member 50, respectively. In this way, the support member 50 (i.e., flow direction plate 40) is supported so as to extend substantially vertically.

As illustrated in FIG. 20, when the cooling fan unit 36 adjacent to the slope 50c of the support member 50 is inserted and held in the casing 32, the base 52-2a of the leaf spring 52-2 comes into contact with an upper surface 36a of the cooling fan unit 36 and is raised. The leaf spring 52-2 is raised, comes into contact with the slope 50c of the support member 50, and presses the slope 50c of the support member 50. When the cooling fan unit 36 adjacent to the slope 50b of the support member 50 is inserted and held in the casing 32, the base 52-1a of the leaf spring 52-1 comes into contact with the upper surface 36a of the cooling fan unit 36 and is raised. The leaf spring 52-1 is raised, comes into contact with the slope 50b of the support member 50, and presses the slope 50b of the support member 50.

Accordingly, when both the cooling fan units 36 adjacent to the slopes 50b and 50c of the support member 50 are held, because the leaf spring 52-1 presses the slope 50b and the leaf spring 52-2 presses the slope 50c, the support member 50 is maintained so as to extend in a substantially vertical direction without falling in both directions.

Figure 22:
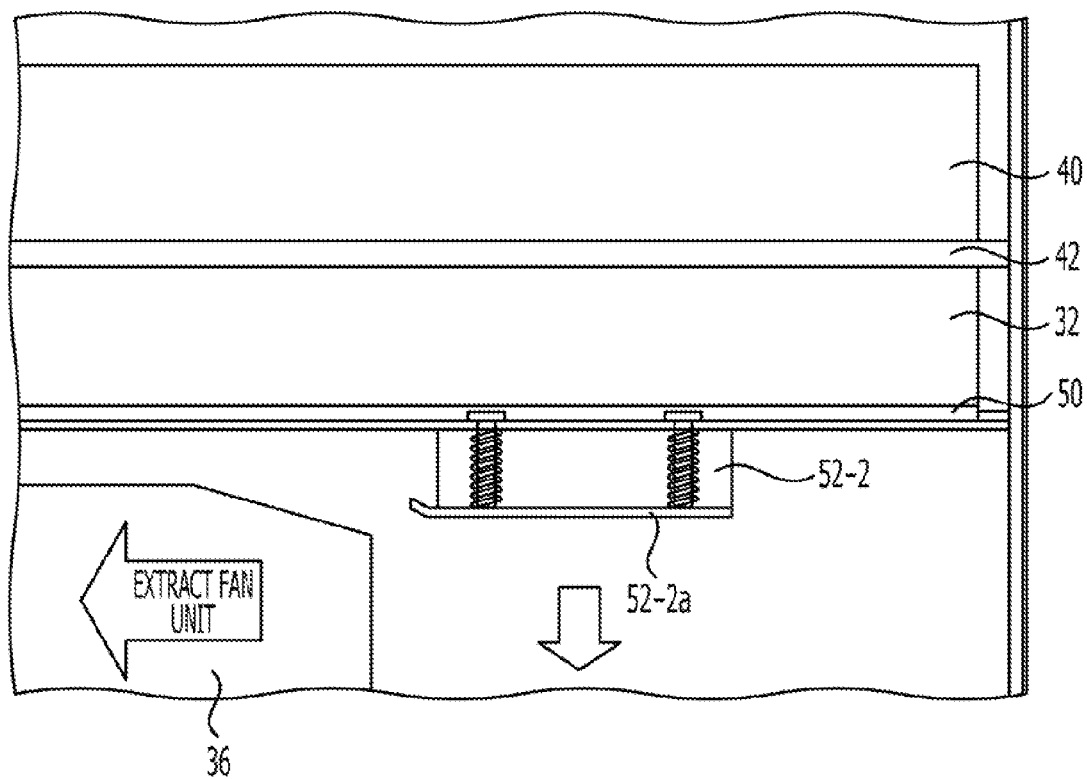
FIG. 22 is a side view of the automatic pivoting mechanism when the flow direction plate is inclined.
Figure 23:
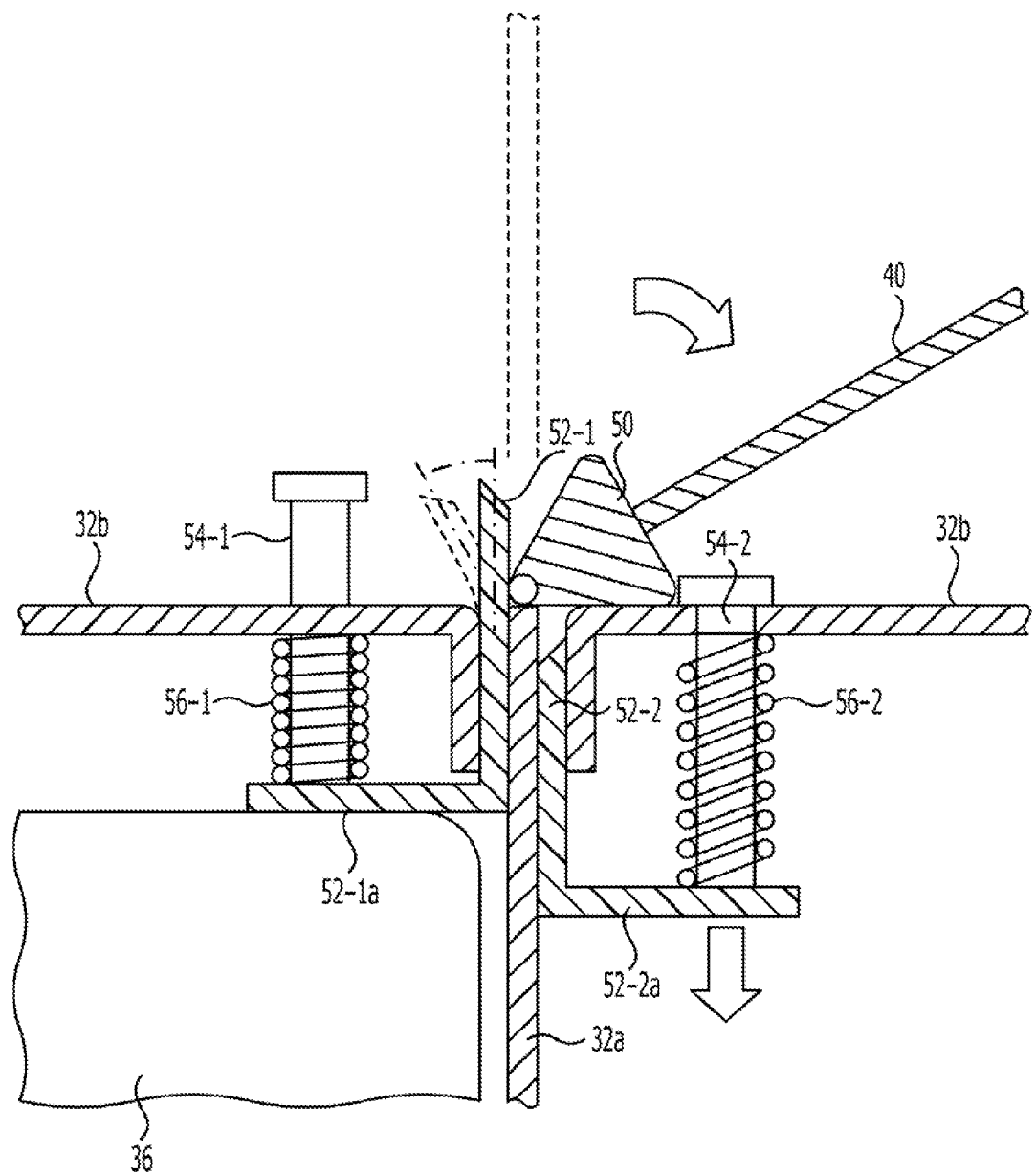
FIG. 23 is a cross-sectional view of the automatic pivoting mechanism when the flow direction plate is inclined.

If the cooling fan unit 36 adjacent to the slope 50c of the support member 50 in the state illustrated in FIG. 21 is extracted, the base 52-2a becomes detached from the upper surface 36a of the cooling fan unit 36, as illustrated in FIG. 22. The leaf spring 52-2 is moved downward by an urging force on the base 52-2a by the coil spring 56-2. Accordingly, the leaf spring 52-2, which presses the slope 50c of the support member 50, is moved downward and the pressing force on the slope 50c is lost, and thus the support member 50 can fall toward the slope 50c, as illustrated in FIG. 23. At this time, because the slope 50b of the support member 50 is in contact with the elastically deformed leaf spring 52-1, the slope 50b is pressed toward the slope 50c by a returning force of the leaf spring 52-1, and the support member 50 (i.e., flow direction plate 40) is made to fall toward the slope 50c.

As illustrated in FIG. 21, the cooling fan unit 36 includes an oblique surface 36b at the rear end of the upper surface. The oblique surface 36b facilitates the base 52-2a to ride on the cooling fan unit 36 when the cooling fan unit 36 is inserted.

With the above-described automatic pivoting mechanism, the flow direction plate 40 can pivot in conjunction with an operation of extracting the cooling fan unit 36, the opened area produced by the extraction of the cooling fan unit 36 can be automatically closed, and an insertion of the cooling fan unit 36 enables the flow direction plate 40 to pivot and return to a substantially vertical position.

A supporting and fixing mechanism of causing the flow direction plate 40 to fall or return not automatically but manually is described next.

First, for the example illustrated in FIGS. 24A and 24B, the flow direction plate 40 is provided with a pivoting plate 40a having the shape of a sector at its lower end. When the flow direction plate 40 pivots, the pivoting plate 40a pivots about the pivotal point of the sector. The cooling fan unit 36 is provided with spring buttons 60 on the front surface. The pivoting plate 40a is fixed at the location where the flow direction plate 40 extends substantially vertically by causing the spring buttons 60 to be in contact with and engaged with the right and left straight lines of the pivoting plate 40a.

Each of the spring buttons 60 is pressed by a spring and projects from the front surface of the cooling fan unit 36. When the spring button 60 is pushed into the front surface, the spring button 60 is disengaged from the pivoting plate 40a. This enables the pivoting plate 40a to pivot in a direction opposite to the pushed spring button 60 and enables the flow direction plate 40 to be inclined. While the flow direction plate 40 is inclined, the spring button 60 is maintained in the state where it is pressed and pushed into the front surface by the pivoting plate 40a. When the inclined flow direction plate 40 is returned to a substantially vertical position, the spring button 60 can automatically project by the force of the spring and be engaged with the straight lines of the pivoting plate 40a again.

Accordingly, a user cannot extract a cooling fan unit 36 unless he or she pushes both the spring buttons 60 of cooling fan units 36 at both sides of the cooling fan unit 36 to be extracted and makes the flow direction plates 40 at both sides inclined. In this manner, an opened area is always closed in extracting the cooling fan unit 36.

For the above-described example, the cooling fan unit 36 is provided with the spring buttons 60. Alternatively, the cooling fan unit 36 may include no additional elements. For an example illustrated in FIGS. 25A and 25B, the cooling fan unit 36 is not provided with the spring buttons 60, and the pivoting plate 40a is fixed by being secured to the casing 32 by a screw. That is, the pivoting plate 40a has a through hole in its central portion, a screw 62 passes through the through hole and into a screw hole formed in, for example, the separator 32a of the casing 32, and the pivoting plate 40a is fixed so as to extend substantially vertically.

Accordingly, a user cannot extract a cooling fan unit 36 unless he or she removes the screws 62 fixing the pivoting plate 40a at both sides of the cooling fan unit 36 to be extracted and makes the flow direction plates 40 at both sides inclined. In this manner, an opened area is always closed in extracting the cooling fan unit 36.

In addition to the examples described above, various mechanisms can be used as the supporting and fixing mechanism. For an example illustrated in FIGS. 26A, 26B, and 26C, the rotating shaft of the flow direction plate 40 has a dual structure, the rotating shaft includes a stopper, and the flow direction plate 40 is fixed at a location corresponding to the stopper engaged with any one of a plurality of recesses of the casing 32. The rotating shaft includes an outer shaft 40b, an inner shaft 40c, and a stopper 40d. The outer shaft 40b is rotatable with respect to the inner shaft 40c, and the flow direction plate 40 and the stopper 40d are fixed to the outer shaft 40b. The outer shaft 40b is axially movable with respect to the inner shaft 40c.

Figure 26C:
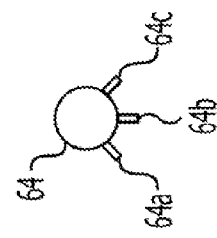
FIGS. 26A, 26B, and 26C are illustrations for describing still another example of the mechanism used when the flow direction plate is manually operated.
Figure 26B:
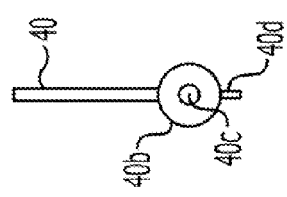
Figure 26A:
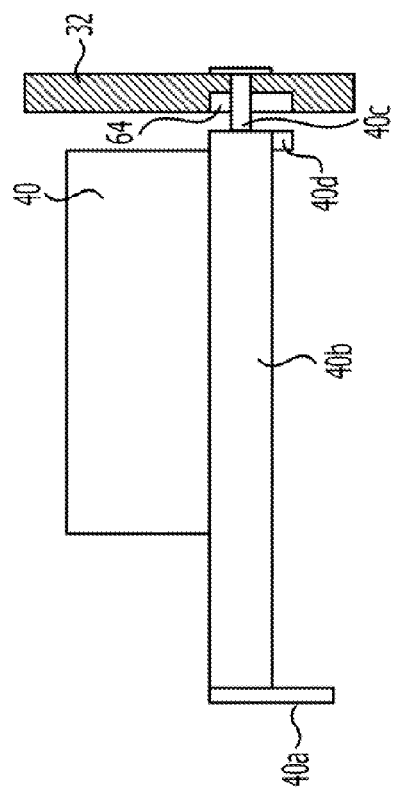
Figure 27A:
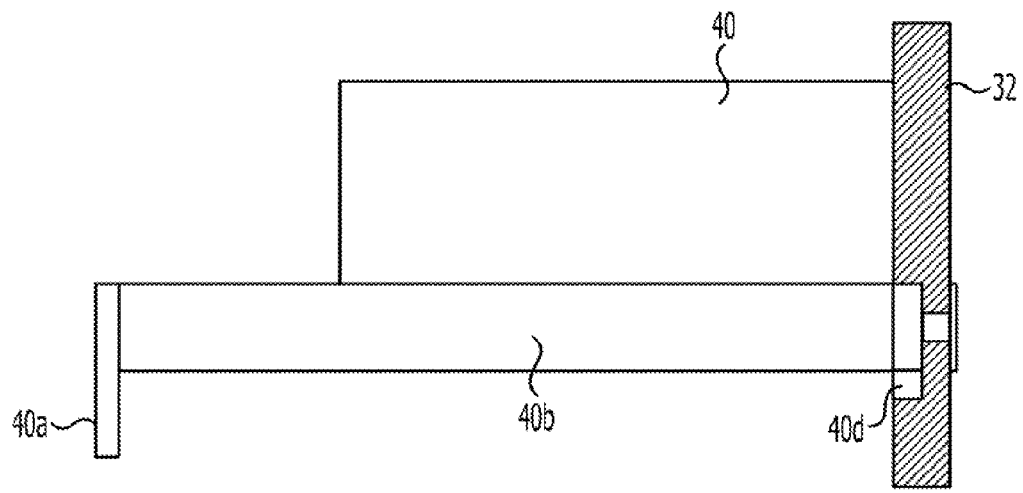
FIGS. 27A and 27B illustrate a state where the rotation position of the flow direction plate in the mechanism illustrated in FIGS. 26A, 26B, and 26C is fixed.
Figure 27B:
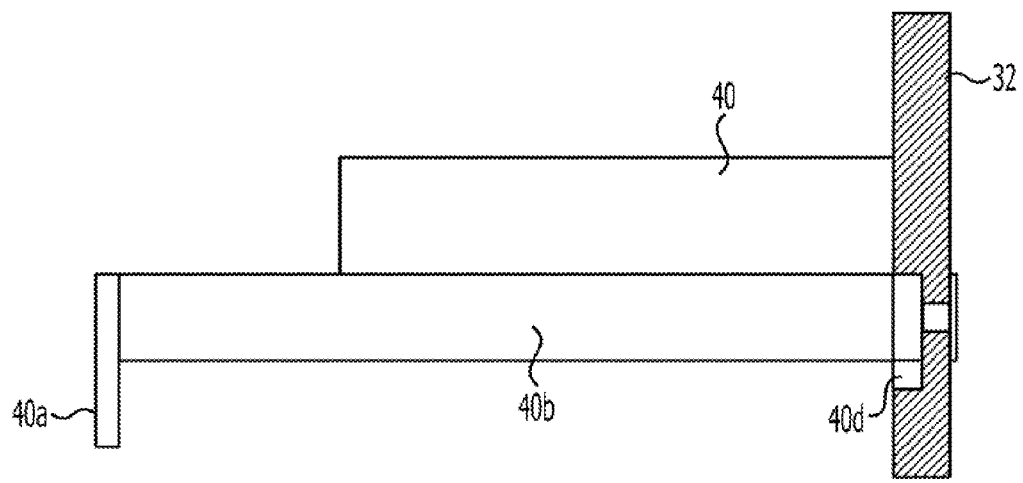

The casing 32 is provided with a recess 64 having a substantially planar shape in a wall to which the inner shaft 40c is attached, as illustrated in FIG. 26C. The recess 64 includes a circular section having a substantially circular shape and three substantially rectangular grooves 64a, 64b, and 64c extending from the circular section. The circular section of the recess 64 is the section with which the outer shaft 40b of the flow direction plate 40 can be engaged, and each of the grooves 64a, 64b, and 64c is the section with which the stopper 40d can be engaged. That is, when the outer shaft 40b of the flow direction plate 40 is inserted into and engaged with the circular section of the recess 64 such that the stopper 40d is inserted into the groove 64b of the recess 64, as illustrated in FIG. 27A, the flow direction plate 40 is fixed at a location where it extends substantially vertically. When the outer shaft 40b of the flow direction plate 40 is inserted into and engaged with the circular section of the recess 64 such that the stopper 40d is inserted into the groove 64a or 64c of the recess 64, as illustrated in FIG. 27B, the flow direction plate 40 is fixed at a location where it is inclined.

A user can disengage the stopper 40d from the groove 64a, 64b, or 64c by pulling the pivoting plate 40a frontward and can fix the flow direction plate 40 at a location where it extends substantially vertically or a location where it is inclined by causing the pivoting plate 40a to pivot, thus rotating the outer shaft 40b, moving the stopper 40d to a desired location, and then pushing the outer shaft 40b. The outer shaft 40b may also be urged in the direction of the recess 64 by, for example, a spring.

As described above, an opened area produced by detachment of a cooling fan unit from the casing of the apparatus is closed by a plate member. Accordingly, even when one cooling fan unit is detached, air flow from other cooling fans does not leak, and a decrease in cooling efficiency can be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An apparatus, comprising:
   a casing;
   a plurality of cooling fan units arranged in line on a lower portion of the casing and capable of being inserted into and removed from the casing on an individual basis;
   a plurality of plate members disposed above the line in which the cooling fan units are arranged and above a gap between the cooling fan units, the plate members extending in a direction to which an upper surface of each of the cooling fan units is substantially perpendicular and in which the cooling fan unit is inserted into and removed from the casing;
   a plurality of automatic pivoting mechanisms for causing, respectively, the plurality of plate members to pivot in conjunction with an operation of inserting or removing the cooling fan units, the plurality of automatic pivoting mechanisms include
      a support member having a substantially triangular shape attached to the lower end portion of the plate member such that a vertex of the substantially triangular shape faces downward, and
      leaf springs supporting the support member from both sides, the leaf springs rising or descending in conjunction with the operation of inserting or removing a cooling fan unit.

2. The apparatus according to claim 1, wherein each of the plurality of plate members has a width that is substantially half a width of the cooling fan, and
   a pair of the plurality of plate members pivot about their respective lower end portions by approximately 90 degrees to close an opened area produced by extraction of a cooling fan unit from the casing.

3. The apparatus according to claim 1, wherein each of the plurality of plate members has a width that is longer than half of a width of the cooling fan, and
   a pair of the plurality of plate members pivot about their respective lower end portions and, in a state where the two plate members are inclined, their respective upper end portions come into contact with each other or become adjacent to each other to close an opened area produced by extraction of a cooling fan unit from the casing.

4. The apparatus according to claim 1, wherein the leaf springs can elastically be deformed when pressed against a slope of the support member.

5. An apparatus comprising:
   a casing;
   a plurality of cooling fan units arranged in line on a lower portion of the casing and capable of being inserted into and removed from the casing on an individual basis;
   a plurality of plate members disposed above the line in which the cooling fan units are arranged and above a gap between the cooling fan units, the plate members extending in a direction to which an upper surface of each of the cooling fan units is substantially perpendicular and in which the cooling fan unit is inserted into and removed from the casing; and
   a plurality of supporting and fixing mechanisms for supporting, respectively, the plurality of plate members to pivot and to fix the plurality of plate members at a location where the plurality of plate members extend substantially vertically, the plurality of supporting and fixing mechanisms include a pivoting plate having a substantially sector shape and attached to the lower end portion of the plate member, a projection disposed on a front surface of a cooling fan unit, and the projection being in contact with one of two straight line portions of the pivoting plate at a location where the plate member extends substantially vertically, and the projection is elastically displaced by being pressed.

6. An apparatus comprising:

a casing;

a plurality of cooling fan units arranged in line on a lower portion of the casing and capable of being inserted into and removed from the casing on an individual basis;

a plurality of plate members disposed above the line in which the cooling fan units are arranged and above a gap between the cooling fan units, the plate members extending in a direction to which an upper surface of each of the cooling fan units is substantially perpendicular and in which the cooling fan unit is inserted into and removed from the casing; and a plurality of supporting and fixing mechanisms for supporting, respectively, the plurality of plate members to pivot and to fix the plurality of plate members at a location where the plurality of plate members extend substantially vertically, the plurality of supporting and fixing mechanisms include a pivoting plate having a substantially sector shape and attached to the lower end portion of the plate member, a through hole disposed in the pivoting plate, and a screw passing through the through hole of the pivoting plate and into a screw hole disposed in part of the casing.

7. An apparatus comprising a casing;

a plurality of cooling fan units arranged in line on a lower portion of the casing and capable of being inserted into and removed from the casing on an individual basis;

a plurality of plate members disposed above the line in which the cooling fan units are arranged and above a gap between the cooling fan units, the plate members extending in a direction to which an upper surface of each of the cooling fan units is substantially perpendicular and in which the cooling fan unit is inserted into and removed from the casing; and a plurality of supporting and fixing mechanisms for supporting, respectively, the plurality of plate members to pivot and to fix the plurality of plate members at a location where the plurality of plate members extend substantially vertically, the plurality of supporting and fixing mechanisms include a pivoting plate attached to a first end of the rotating shaft, a stopper attached to a second end of the rotating shaft, a recess disposed in a portion that faces the second end of the rotating shaft and includes a groove, and a rotating shaft attached to a plate member and fixed at a predetermined rotation location by engagement of the stopper with the groove.

\* \* \* \* \*